United States Patent [19]

Kametani et al.

[11] Patent Number: 5,371,653

[45] Date of Patent: Dec. 6, 1994

[54] CIRCUIT BOARD, ELECTRONIC CIRCUIT CHIP-MOUNTED CIRCUIT BOARD AND CIRCUIT BOARD APPARATUS

[75] Inventors: Masatsugu Kametani; Kazuhiro Umekita, both of Ibaraki, Japan

[73] Assignee: Hitachi, Ltd., Tokyo, Japan

[21] Appl. No.: 29,919

[22] Filed: Mar. 11, 1993

Related U.S. Application Data

[63] Continuation of Ser. No. 462,778, Jan. 10, 1990, abandoned.

[30] Foreign Application Priority Data

Jan. 13, 1989 [JP] Japan .................. 1-004923

[51] Int. Cl.⁵ .................. H05K 7/20; H05K 1/11
[52] U.S. Cl. .................. 361/721; 174/252; 174/255; 361/711; 361/712; 361/714; 361/716; 361/684; 361/720; 361/792; 361/794; 361/795; 361/760; 361/780; 434/68; 434/485
[58] Field of Search .................. 29/832, 837, 840, 845; 174/255, 260, 262, 263, 252; 228/180.1, 180.2, 180.21; 257/668, 690, 692, 693, 698, 723, 724, 778, 779, 784; 361/400, 403, 405, 414, 417, 418, 419, 724, 760, 761, 764, 767, 772, 773, 777, 779, 780, 792, 793, 794, 795; 437/209, 215; 439/68, 78, 83

[56] References Cited

U.S. PATENT DOCUMENTS

| | | | |
|---|---|---|---|
| 3,436,604 | 4/1969 | Hyltin et al. | 361/385 |
| 3,568,000 | 3/1971 | D'Aboville | 361/394 |
| 4,030,190 | 6/1977 | Varker | 361/414 |
| 4,054,483 | 10/1977 | Peiffer | 156/634 |
| 4,485,429 | 11/1984 | Mittal | 361/386 |
| 4,535,385 | 8/1985 | August et al. | 361/388 |
| 4,587,594 | 5/1986 | McPherson | 361/383 |
| 4,628,407 | 12/1986 | August et al. | 361/388 |
| 4,685,033 | 8/1987 | Inoue | 361/414 |
| 4,710,854 | 12/1987 | Yamada et al. | 174/258 |
| 4,916,260 | 4/1990 | Broaddus et al. | 174/268 |
| 5,136,471 | 8/1992 | Inasaka | 361/414 |

FOREIGN PATENT DOCUMENTS

| | | | |
|---|---|---|---|
| 0052738 | 2/1982 | European Pat. Off. | 361/397 |
| 0054597 | 6/1982 | European Pat. Off. | |
| 0129966 | 1/1985 | European Pat. Off. | |
| 148898 | 11/1981 | Japan | |
| 35598 | 2/1985 | Japan | |
| 248500 | 5/1986 | Japan | |
| 61-174754 | 8/1986 | Japan | 257/693 |
| 198200 | 9/1987 | Japan | |
| 0307768 | 12/1988 | Japan | 361/386 |

OTHER PUBLICATIONS

IBM Technical Disclosure Bulletin "Multi-Technology Chip Carrier" vol. 30 No. 2 Jul. 1987.
Computer Design "Innovative Package Emerge To Carry Faster, Denser Chips", A. DeSena, vol. 27, No. 18, 1st, Oct. 1988.
IBM Technical Disclosure Bulletin "Heat Dissipation from IC Chips Through Module Package" vol. 19 No. 11 Apr. 1977.
IBM Technical Disclosure Bulletin "Control of Thermal Coefficient Of Expansion Of Substrate Materials" vol. 19 No. 8 Jan. 1977.
IBM Technical Disclosure Bulletin "Multichip Packaging" vol. 14 No. 10 Mar. 1972.
IBM Technical Disclosure Bulletin vol. 19, No. 11 Apr. 1977 D. Balderes, J. R. Lynch, and R. A. Yacavonis.

*Primary Examiner*—Leo P. Picard
*Assistant Examiner*—Donald A. Sparks
*Attorney, Agent, or Firm*—Antonelli, Terry, Stout & Kraus

[57] ABSTRACT

A circuit board includes a circuit-conductor layer, a ground layer and a power source layer superposed in a multilayer form through dielectric layers therebetween, A heat conduction through inside of the circuit board is enhanced so that circuit chips mounted on the circuit board can be cooled down to a level capable of operating normally, The circuit board can be formed to be compact, In order to enhance the heat transfer in the circuit board, at least one of the ground layer and power source layer is formed in a multilayer manner, It is preferable to form these layers at a thickness larger than that of the circuit-conductor layer, Further, preferably, the pin of the chip mounted on the board and at least one of the ground layer and power supply layer are connected to each other in such a manner as to enhance the heat conduction.

4 Claims, 10 Drawing Sheets

CIRCUIT BOARD, ELECTRONIC CIRCUIT CHIP-MOUNTED CIRCUIT BOARD AND CIRCUIT BOARD APPARATUS

This application is a continuation of application Ser. No. 07/462,778, filed on Jan. 10, 1990, now abandoned.

BACKGROUND OF THE INVENTION

The present invention relates to a circuit board that is superior in heat dissipation and that has a compact structure, and to an electronic circuit chip-mounted circuit board where electronic circuit chips are mounted on the circuit board. The invention also relates to a circuit board apparatus in which such chip-mounted circuit boards are mounted on a mother board.

Electronic circuit chips generate heat during operation. If these circuit chips are not cooled down, the temperature of the chips is increased so that the chips would not be operated normally. It is therefore necessary to cool the chips. The electronic circuit chips are generally mounted on a circuit board. There is such a technique according to the prior art that, in order to cool the electronic circuit chips mounted on the circuit board, fins are provided on electronic circuit chips or packages, and these fins are cooled by air or water. In addition, as shown in U.S. Pat. No. 4,608,407 and Japanese Patent Unexamined Publication No. 61-248500 (A), cooling plates are mounted on an outside of the circuit board to cool the electronic circuit packages. It is also proposed to a system, as shown in Japanese Patent Unexamined Publication No. 62-198200 (A), in which cooling liquid is sealed in a box-shaped heat panel in intimate contact with the circuit board in an interior or a back side of the circuit board. Also, it is proposed provide a circuit chip-mounted circuit board with a specific guide member for defining a duct for cooling circuit chips on the circuit board (Japanese Patent Unexamined Publication No. 56-148898).

However, the above-described prior art proposals do not take into consideration the space needed for the cooling equipment and cost thereof. It has been difficult to mount plural or multiple circuit boards, on which chips are mounted, with a high density. In addition, the cost per one circuit board has been high.

SUMMARY OF THE INVENTION

An object of the invention is to provide an electronic circuit board having a compact cooling means with a sufficient cooling performance to cool electronic circuits mounted thereon so that the circuits may operate normally, a circuit chip-mounted circuit board where circuit chip(s) is(are) mounted on such board, and an electronic circuit apparatus-or system having a plurality of such circuit chip-mounted circuit boards.

Another object of the invention is to provide an electronic circuit board where noise due to cross-talk may be reduced.

Still another object of the invention is to provide an electronic circuit board in which the operational conditions, such as temperature, power source level, a ground or the like are made uniform within the circuit board.

According to the invention, there is provided a circuit board having a multilayer structure composed of at least one circuit-conductor layer, ground layer and power supply layer through insulative or dielectric layers interposed therebetween, wherein a plurality of circuit-conductor or conductive layers are arranged including the circuit-conductor layer having on either side the ground layer or power supply layer.

According to another aspect of the invention, there is provided a circuit board having a multilayer structure composed of at least one circuit-conductor layer, ground layer and power supply layer through insulative or dielectric layers interposed therebetween, the circuit board being characterized by comprising a plurality of circuit-conductor layers, wherein a sum of the numbers of the power supply layers and the ground layers is larger than the number of the circuit-conductor layers.

According to the invention, there is further provided a circuit board having a multilayer structure composed of at least one circuit-conductor layer, ground layer and power source layer through insulative or dielectric layers interposed therebetween, the circuit board being characterized in that a thickness of at least one ground layer or at least one power supply layer is larger than a thickness of the circuit-conductor layer.

According to another aspect to the invention, there is provided a circuit chip-mounted circuit board in which a circuit board has a multilayer structure composed of at least one circuit-conductor layer, ground layer and power supply layer superposed through insulative layers between the adjacent layers, and on which electronic circuit chip(s) is(are) mounted, wherein at least one pin of the circuit chip is connected to at least one of the ground layer and power supply layer of the circuit board under the condition that the thermal resistance therebetween is small or reduced. The pin connected to the circuit board under the small thermal resistance condition may be a power supply pin (connected to the power supply layer), a ground pin (connected to the ground layer) or any other extra pin. The extra pin may be a pin electrically insulated from an internal circuit of the electronic circuit chip or an input pin which is not used in operation. The extra pin can be connected to the ground layer or the power supply layer.

According to still another aspect of the invention, there is provided a circuit chip-mounted circuit board in which a cooling fluid is caused to flow along and on a circuit board in which at least one circuit-conductor layer, ground layer and power supply layer through insulative or dielectric layers between the adjacent layers, to thereby remove heat generated from a circuit chip on the circuit board, the chip-mounted circuit board being characterized in that a plurality of connectors are arranged at an interval at an upstream end portion of the circuit board in terms of the cooling fluid, and chips which generate much heat during operation are arranged where the flow rate of the cooling fluid is increased by or turbulence is generated by the connectors.

According, to still another aspect of the invention, there is provided a circuit board apparatus for circuit boards, at least one of the circuit boards having a multilayer structure composed of at least one circuit-conductor layer, ground layer and power supply layer through dielectric layers therebetween, wherein ground layers, power supply layers and signal lines on circuit-conductor layers of the circuit boards are connected to associated ground layers, power supply layers and signal lines on circuit conductor layers of a mother board; the power supply layer of the mother board is connected to a power supply plate through a conductive plate; and a ground layer of the mother board is connected to a ground plate through a conductive plate.

In case of the circuit-conductor layer having on both sides thereof the ground layer or the power supply layer through the dielectric layer, in the circuit board according to the invention, it is possible to reduce the impedance of signal line(s) on the circuit-conductor layer and to suppress the noise due to cross-talk by the electrostatic coupling between the parallel conductors. This effect is remarkable as the distance between the circuit-conductor layer and the ground layer or the power supply layer located adjacent to the circuit-conductor layer is shorter. The effect is more remarkable in the case where the ground layer is disposed through the dielectric layer as the neighboring layer, than the case where the power supply layer is disposed through the dielectric layer as the neighboring layer. Also, by providing the power supply and ground layers in a multi-layer form in the circuit board according to the invention, it is possible to reduce the impedance of the power supply and ground layers themselves and it is possible to suppress the change in the electric potentials in the power supply layer(s) and in the ground layer(s) in case of an operation including a number of high frequency components.

In the circuit board or chip-mounted circuit board according to the invention, the heat generated from the heated chip is transferred to the ground layer or power supply layer through pin(s) that are connected to the ground layer or power supply layer in a manner to have a reduced or small thermal resistance. The connection under "condition of small or reduced thermal resistance" includes the electrically insulative but thermally conductive connection as well as the electrically conductive and thermally conductive connection such as soldering. Since the thickness of the ground layer and/or power supply layer is large or a number of these layers are provided, the heat conductivity is high so that the heat is spread over the entire circuit board. The heat transferred to surface(s) of the circuit board can be removed by fluid flowing over a surface(s) of the circuit board. In contrast with the case where the circuit board includes a single power supply layer and a single ground layer, in case of the invention, the plurality of thermally conductive ground layers and power supply layers can be arranged at the locations close to the surface of the circuit board to serve for improved cooling. In the circuit board according to the invention, the heat that has been conducted to the ground layer is transferred mainly to the ground plate through conductive plates. The heat that has been conducted to the power supply layer is transferred mainly to the power supply plate through conductive plates. Thus, the heat that has been transferred to the ground plate and the power source plate is dissipated at their surfaces.

In this case, when the cooling fluid is caused to flow along and on the surfaces of the ground plate and the power supply plate or the corrugation or fins are provided on the surfaces of the ground plate and the power supply plate to increase the surface area, the cooling effect may be enhanced on the surfaces of these plates.

In this apparatus, the power supply unit is connected to the power source plate and the ground plate. The electric power supply is made through these plates to thereby stabilize the power supply line (layer) potential and ground line (layer) potential serving as the reference for the overall circuitry in the apparatus on the power source plate and the ground plate. Accordingly, it is possible to stabilize the power supply layer potential and ground layer potential on the mother board and the daughter boards.

In the chip-mounted circuit board according to the invention, the heat generated from the electronic circuit chip is spread to the entire circuit board through the thermally conductive layers such as the inner ground layer and power supply layer. In addition, as the high temperature chips are arranged where the flow rate of the cooling fluid is increased and the turbulence is generated, it is possible to more effectively cool the chips than the other chips. Thus, the temperature in the circuit board can be made uniform.

In mounting IC chips or LSI chips on the circuit board according to the invention, it is preferable to preheat the circuit board to increase the temperature of the heat conductive layers such as ground layer and power supply layer, so that the difference in the temperature relative to the solder melting point is reduced. Under this condition, the soldering work is performed well. In this case, the heat would hardly escape to the heat conductive layers such as the Dower supply layer(s) and the ground layer(s). It is thus possible to perform good soldering.

In addition, when the insulative or dielectric layers are made of thermally conductive material, the quantity of heat to be transferred from the heated chips to the surface of the circuit board surface on which the chips are mounted is increased. The heat quantity to be transferred through the heat conductive plates to the ground plate and the power source plate is also increased to thereby effectively cool the chips.

BRIEF DESCRIPTION OF THE DRAWINGS

The foregoing and other objects, features and advantages of the present invention will become more apparent by the following description in conjunction with the following drawings in which.

DESCRIPTION OF THE PREFERRED EMBODIMENTS

Figure 1:
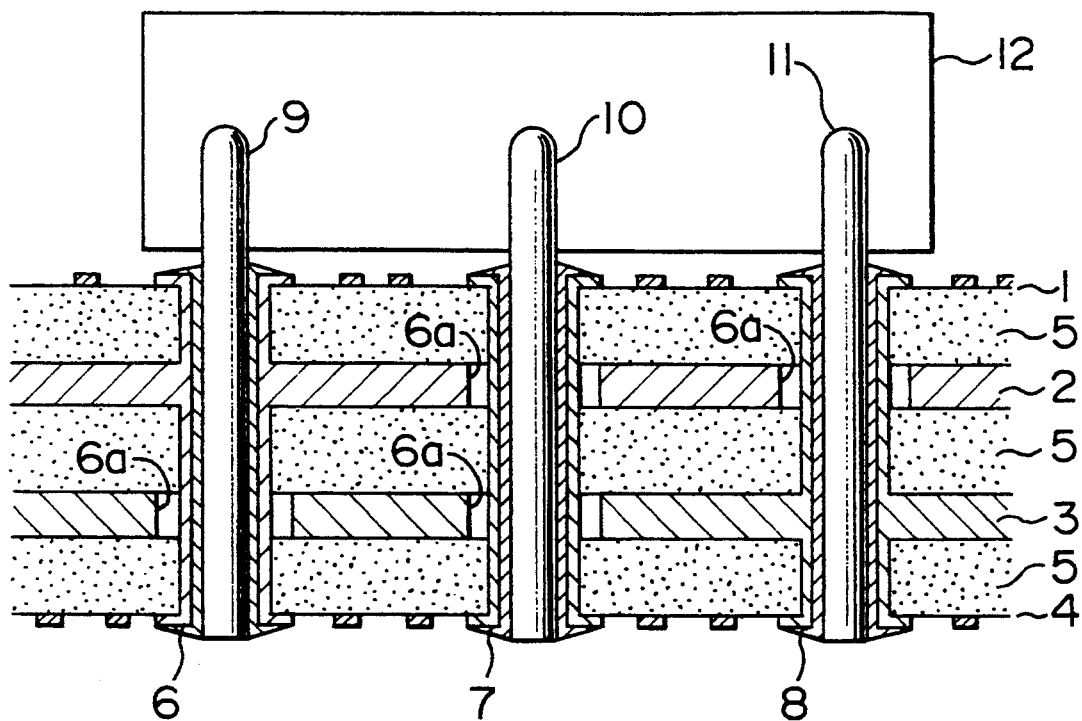
FIG. 1 is a cross-sectional view showing a first embodiment of the invention, and is also utilized for explanation of a seventh embodiment of the invention.

A first embodiment of the invention will now be described with reference to FIG. 1.

A circuit board according to the first embodiment is composed of signal or circuit-conductor layers 1 and 4, a ground layer 2, a power supply layer 3 and insulative or dielectric layers 5. A through-hole 6, a through-hole 7 and through-hole 8 are connected to the ground layer 2, the circuit layers 1 and 4 and the power supply layer 3, respectively. It is to be noted that the term "through-hole" used herein refers not only to a simple penetrating hole but also a hole whose inner wall is plated or coated with a conductive layer. The ground layer 2 and the power supply layer 3 are made of a material having a low electric resistance and a high thermal conductivity, such as copper and are spread over the whole circuit board. In addition, cutout portions in close approximity with the through-holes (such as holes 154 to be described later in conjunction in FIG. 13), escape holes 6a for the through holes, and the like are made as small as possible, while avoiding excessive increase in manufacturing costs, to thereby increase the conductive area. A ground pin 9, a signal pin 10 and a power source pin 11 are implanted in an electronic circuit-chip 12. The ground pin 9, the signal pin 10 and the power supply pin 11 are connected to the through-holes 6, 7 and 8, respectively, by soldering or the like in such a manner as to reduce the thermal resistance therebetween.

In the thus constructed circuit board, heat generated from the electronic circuit chip 12 is transferred or dissipated in the following manner, to thereby cool the electronic circuit chip 12. The heat generated in the electronic circuit chip 12 conducts through the ground pin 9 to the ground layer 2 while conducting through the power supply pin 11 to the power supply layer 3. Since the ground layer 2 and the power supply layer 3 are made of a material having a low electric resistance and a high thermal conductivity, the heat transferred to these layers will conduct through these inner layers to be dissipated primarily in the following three manners.

Firstly, the heat is dissipated by a cooling portion provided at ends of the ground layer 2 and the power supply layer 3. -Secondly, the heat is transferred to surfaces of the circuit board to be dissipated by fluid that flows along the surfaces.

Thirdly, the heat is transferred through ground pin(s) and the power supply pin(s) of the low heat electronic circuit chip(s) whose temperature is lower than the inner ground and power source layers and reaches the surfaces of the low heat electronic circuit chip. The heat is dissipated from the pins and chip surface by the fluid flowing along the surfaces.

In this case, since the surface area of the pins and chips mounted on the circuit board serves for increasing the total surface area of the chip-mounted circuit board so that it is larger than the surface area of the circuit board on which no pins or chips are mounted, the heat transfer area is increased, which is efficient for the cooling aspect.

In addition, a part of the heat is transferred from the heated chip to the chip surface without passing through the inner conductive layers and is dissipated at the chip surfaces, and a part of the heat is transferred to the pin surfaces of the chip and dissipated thereat.

Furthermore, there are effects of cooling by convection and radiation from the respective surfaces. In the above-described various ways, the electronic circuit chip 12 can be cooled.

With such an arrangement, it is possible to impart a function of conducting the heat generated from the electronic circuit chip 12 to the ground layer 2 that has primarily a function of applying a ground potential to the electronic circuit chip 12, and it is also possible to impart a function of conducting the heat generated from the electronic circuit chip 12 to the power supply layer 3 that has primarily a function of applying the power supply potential to the electronic circuit chip 12. Namely, in the circuit board according to this embodiment of the invention, the two functions of application of the respective potential and conduction of the heat are imparted to the ground layer 2 and the power supply layer 3. In addition, as these layers are arranged in the interior of the circuit board, it is unnecessary to provide additional equipment outside the circuit board. Accordingly, it is possible to provide a more compact circuit board that has a cooling ability sufficient to normally operate the electronic circuit within the chip. Although, in the embodiment shown in FIG. 1, the ground layer 2 and the power supply layer 3 are arranged as shown, it is possible to interchange the locations of the ground layer 2 and the power source layer 3 by changing the connection of the pins to the suitable layers, thereby obtaining the same effect.

In the foregoing embodiment one ground layer and one power supply layer are provided. However, when the number of the respective layers is increased, the heat quantity that can be transferred through the layers is increased in comparison with the arrangement of the single ground and power supply layers. The plural layer arrangement is more effective for cooling. In addition, the increase of the numbers of the power supply layers and the ground layers allows impedances of the power supply layers and the ground layers per se to be decreased, thereby suppressing the change in power supply potential and ground potential within the circuit board for the operations including a number of high frequency components.

In order to increase the heat quantity that passes through the ground layer and the power supply layer, it is effective to increase the thickness of each layer. For instance, it is possible to provide a ground layer and a power supply layer each of which has a thickness of 50 to 70 micrometers without any special step in addition to the normal manufacturing steps. This makes it possible to enhance the cooling effect.

Figure 2:
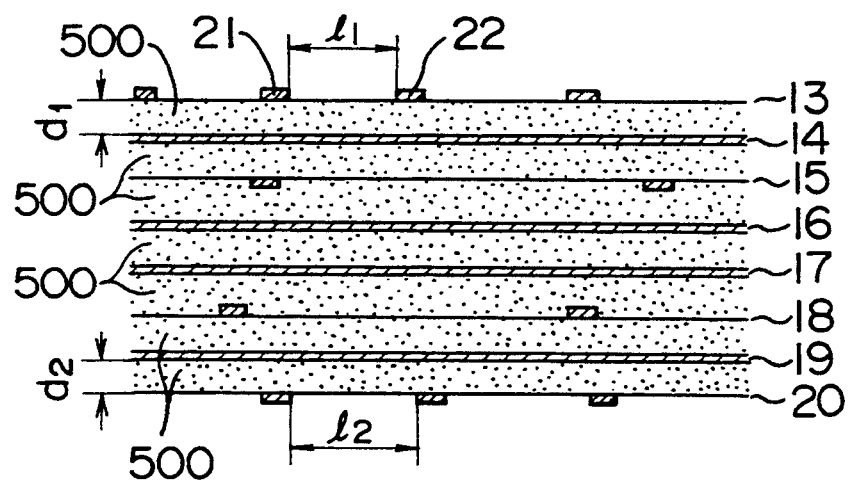
FIG. 2 is a cross-sectional view showing a second embodiment of the invention.

FIG. 2 shows a second embodiment of the invention. The circuit board representing the second embodiment is an example of a circuit board which has eight conductive layers. The circuit board is composed of circuit-conductor layers 13, 15, 18 and 20, ground layers 14 and 19, power supply layers 16 and 17 and dielectric layers 500. Conductors 21 and 22 are on the circuit-conductor layer 13. The circuit-conductor layer 13 is arranged at a side receiving the chips thereon, whereas the circuit-conductor layer 20 arranged at a side of the soldering surface. The ground pins, power supply pins and signal pins (not shown in FIG. 2) are connected to the associated layers in a manner to reduce the thermal resistance as shown in FIG. 1.

The circuit board according to the second embodiment can cool the electronic circuit chips in the same manner as in the first embodiment. In addition, the circuit board can operate as follows.

In general, there is a fear that the circuit conductors arranged in parallel to each other in the circuit layer would form an electrostatic coupling therebetween to generate a noise due to cross-talk. However, if, as shown in FIG. 2, the ground layer or the power supply layer is arranged adjacent to the circuit-conductor layer through the dielectric layer so that the distance between the circuit-conductor layer and the ground layer or the power supply layer adjacent thereto through the dielectric layer is decreased, it is possible to reduce the impedance of the conductors in the circuit layer. As a result, the noise due to cross-talk of the electrostatic coupling between the parallel signal conductors is suppressed. This effect is more remarkable in the case where the ground layer is arranged adjacent to the circuit-conductor layer through the dielectric layer than the case where the power supply layer is arranged adjacent to the circuit-conductor layer. As a result, it is possible to more effectively reduce the noise of the cross-talk. It is possible to more effectively reduce the noise due to the cross-talk generated on the circuit layers 13 and 20, if the following relationships are met:

$l_1 > d_1$, and $l_2 > d_2$ respectively where
"$l_1$" is the minimum distance between the parallel conductors arranged on the circuit-conductor layer 13;
"$d_1$" is the distance between the surfaces of the circuit-conductor layer 13 and the ground layer 14;
"$l_2$" is the minimum distance between the parallel conductor arranged on the circuit-conductor layer 20; and
"$d_2$" is the distance between the surfaces of the circuit-conductor layer 20 and the ground layer 19.

In addition, in the circuit board according to this embodiment, it is possible to reduce the impedance of a power supply and ground layers per se by providing the plurality of power supply and ground layers therein. Accordingly, it is possible to suppress the change in the electric potentials of the power supply and ground layers within the circuit board in case of the operation including a number of high frequency components.

Furthermore, in the circuit board according to this embodiment, since the heat generated from the electronic circuit chips is spread over the entire circuit board through the inner layers, i.e., the ground layers and the power supply layers, it is possible to make the temperature uniform over the circuit board.

According to this embodiment, it is possible to enjoy simultaneously the foregoing two effects, to make uniform the temperature and the power supply voltage and ground potential within the circuit board while suppressing the change in the ground and power supply levels within the circuit board. As a result, with the circuit board according to this embodiment, it is easy to perform a delay control or the like to thereby finely design the timing operation.

As described above, according to the second embodiment, there is provided an eight conductor layer circuit board which can reduce the space needed for the cooling equipment at a lower cost than by a conventional technique for cooling the electronic circuit chips on the circuit board, similarly to the first embodiment. In addition, it is possible to reduce noise due to cross-talk generated in the signal conductors and to suppress the change in power supply potential and ground potential within the circuit board in case of an operation including a number of high frequency components. Furthermore, it is possible to make the temperature uniform over the circuit board.

The effect to reduce the noise due to cross-talk can be attained in the second embodiment as in the first embodiment. This is effective when the distance between the circuit-conductor layer 1 and the ground layer 2 and the distance between the circuit-conductor layer 4 and the power supply layer 3 are decreased in FIG. 1. Furthermore, when the distance between the surfaces of the circuit-conductor layer 1 and the ground layer 2 is smaller than the minimum distance between the parallel conductors in the circuit-conductor layer 1, and when the distance between the surfaces of the circuit-conductor layer 4 and the power supply layer 3 is smaller than the minimum distance between the parallel conductors in the circuit-conductor layer 4, it is possible to more effectively reduce the noise due to cross-talk.

The effect to make the temperature uniform over the circuit board may be attained in the first embodiment as well.

Figure 8:
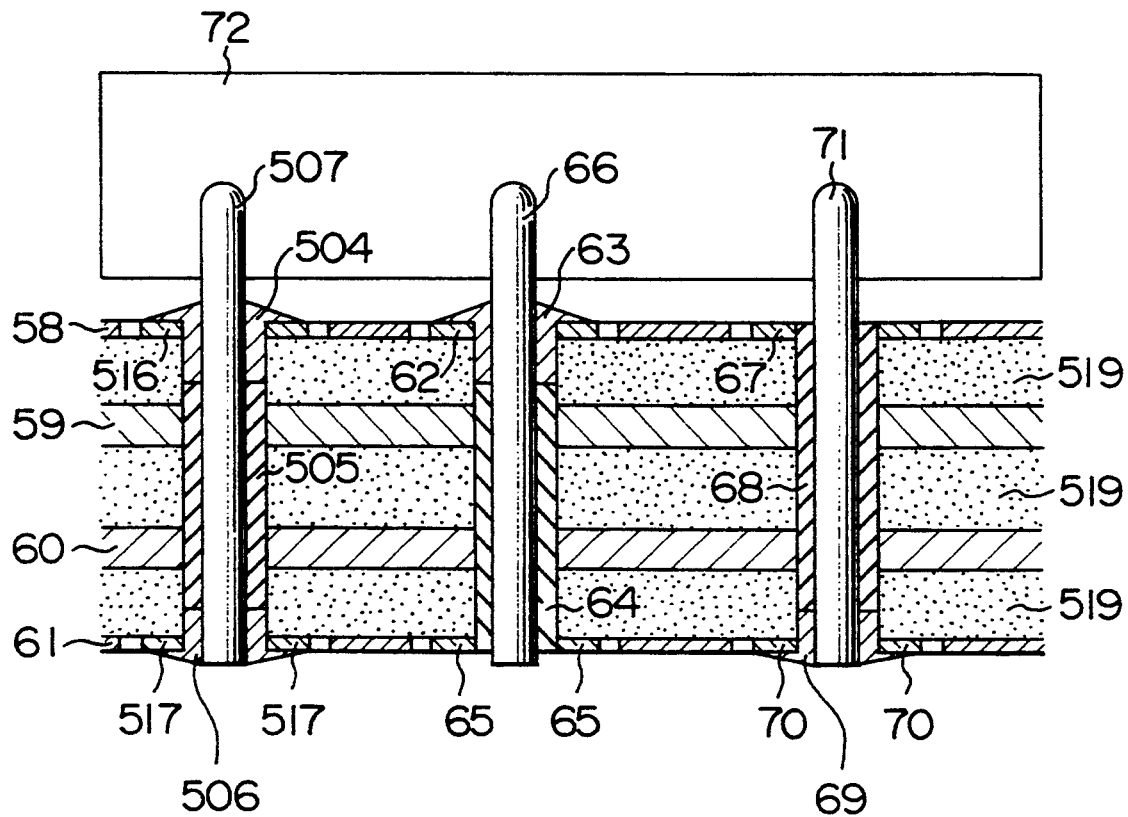
FIG. 8 is a cross-sectional view showing a ninth embodiment of the invention.

In addition, the embodiment shown in FIG. 8 is only one of the examples of an eight layer circuit board according to an embodiment of the invention. As far as the power supply layer or the ground layer is arranged adjacent to the circuit-conductor layer through the dielectric layer, the effect of the embodiment of the present invention can be similarly obtained even if the order of the layers is changed. In this case, if the distance from the circuit conductor layer to the ground layer or the power supply layer adjacent thereto through the dielectric layer is decreased in the same manner as in the second embodiment shown in FIG. 2, it is possible to effectively reduce the noise due to cross-talk. This effect is more remarkable in the case where the neighboring layer is the ground layer than the case where the neighboring layer is the power supply layer. The noise due to cross-talk can be effectively reduced if the relationship $l > d$ exists, where $l$ is the minimum distance between the parallel conductors of a certain circuit-conductor layer and $d$ is the distance between the circuit-conductor layer and a conductive ground or power supply layer that is closest to the circuit-conductor layer.

In the second embodiment, the power supply layer or the ground layer is arranged adjacent to each of the circuit-conductor layers through the dielectric layer. This is the case where the effect of the invention is utilized as much as possible. It is possible to arrange the ground layer or the power source layer through the dielectric layer adjacent only to the circuit-conductor layer where the cross-talk is likely to be generated. In this case, the arrangement of the other circuit-conductor layers may not be limited. For example, in FIG. 2, it is possible to arrange a circuit-conductor layer instead of the power supply layer 17. Although stability of the circuit-conductor layer 18 and this circuit-conductor layer against cross-talk therebetween is lowered, it is sufficient to use the circuit-conductor layer 15 as the signal lines, where the cross-talk is likely to be generated, because the layer 15 is protected on both sides by the ground layer 14 and the power supply layer 16. It is possible to obtain the effect of the invention in such an arrangement. In this way, it is possible to provide a circuit board having the same number of circuit-conductor layers but a small number of conductive layers in comparison with the case where the power supply layer or the ground layer is provided adjacent to either side of every circuit-conductor layer through the dielectric layer. Thus, it is possible to manufacture the circuit board at a lower cost.

Figure 3:
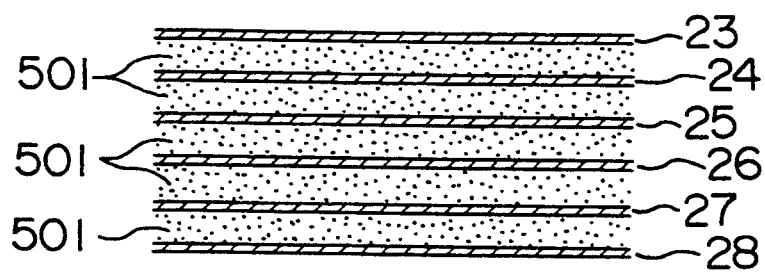
FIG. 3 is a cross-sectional view showing a third embodiment of the invention.

FIG. 3 shows a third embodiment of the invention. The circuit board shown in FIG. 3 is composed of six conductive layers. Namely, the circuit board is composed of circuit-conductor layers 23, 26 and 28, ground layers 24 and 27, a power supply layer 25 and dielectric layers 501. The circuit-conductor layer 23 is arranged to receive the chips thereon whereas the circuit-conductor layer 28 is arranged to be the soldering surface. The electronic circuit chip, the ground pin, power supply pin and signal pin each extending from the chip are not shown in FIG. 3, but pins are connected to the associated layers in such a manner as to reduce the thermal resistance as shown in FIG. 1.

With the thus constructed circuit board, similarly to the second embodiment, it is possible to cool the chips on the circuit board while reducing the space needed for the cooling equipment at a lower cost than that of the prior art. Also, it is possible to suppress the change in power supply and ground potentials within the circuit board in case of the operation including a number of high frequency components while suppressing the noise due to the cross-talk of the conductors. In addition, it is also possible to make the temperature uniform over the circuit board.

It is, however, noted that the embodiment shown in FIG. 3 is a simple one example of the six layer circuit board. Therefore, as far as the circuit board includes at least one circuit-conductor layer having on either side the ground layer or power supply layer through the dielectric layer, the circuit board according to the embodiment of the invention may be realized even if the layer arrangement is different from that shown in FIG. 3.

When the distance between the circuit-conductor layer and the adjacent ground layer or power supply layer through the dielectric layer is shortened in the same manner as in the second embodiment, it is also possible to effectively reduce the noise due to cross-talk. This effect is more remarkable in the case where the neighboring layer is the ground layer than the case the neighboring layer is the power supply layer. Also, in order to effectively reduce the noise due to cross-talk, the following condition is preferred to be satisfied:

$l > d$ where "l" is the minimum distance of the parallel conductors on the circuit-conductor layer and "d" is the shorter distance between the circuit layer and the adjacent layer of the ground layer or the power supply layer through the dielectric layer.

Figure 4:
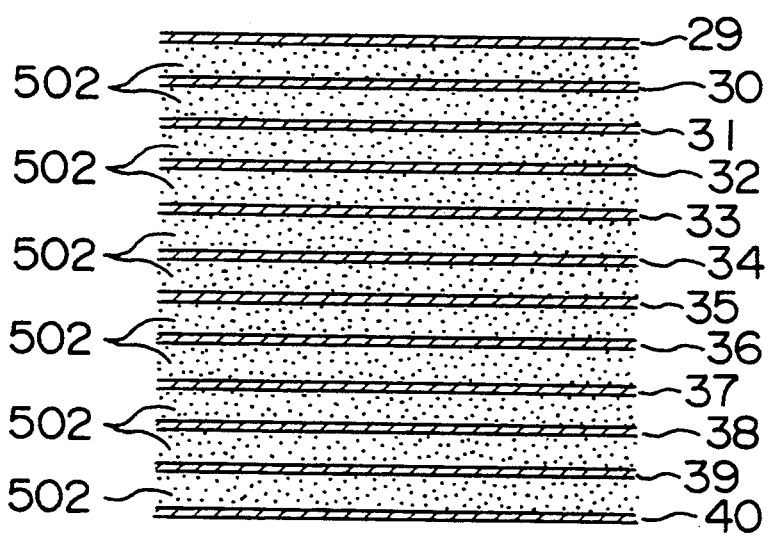
FIG. 4 is a cross-sectional view showing a fourth embodiment of the invention.

FIG. 4 shows a fourth embodiment of the invention. The circuit board shown in FIG. 4 is an example of twelve conductive-layers circuit board. Namely, the circuit board is composed of circuit-conductor layers 29, 33, 38 and 40, ground layers 30, 32, 34, 37 and 39, power supply layers 31, 35 and 36, and dielectric layers 502. The electric potentials of the power supply layers 31, 35 and 36 may be the same or different from each other. The circuit-conductor layer 29 is arranged toward a side of the chips, whereas the circuit-conductor layer 40 is arranged to be the soldering surface. None of the electronic circuit chip, the ground pin, power supply pin and signal pin each extending from the chip is shown in FIG. 4, but these pins are connected to the associated layers in the manner to reduce the thermal resistance similarly to FIG. 1.

With such a twelve-layer arrangement, similarly to the second embodiment, it is possible to cool the chips on the circuit board while reducing the space needed for the cooling equipment at a lower cost than that of the prior art. In addition, it is possible to reduce the noise due to cross-talk of the conductors to suppress the change in power supply potential and ground potential within the circuit board in case of high frequency operation, and to make the temperature uniform over the board.

It should be however noted that FIG. 4 is only an example of a twelve layer circuit board. As far as the circuit board has at least one circuit-conductor layer having on either side the ground layer or power source layer through the dielectric layer, the effect of the invention may be obtained. Similarly to the second embodiment, the distance between the circuit-conductor layer and the nearest-neighboring ground or power supply layer through the dielectric layer is decreased, it is possible to effectively reduce the noise due to the cross-talk. This effect is more remarkable in the case where the neighboring layer is the ground layer than the case where the neighboring layer is the power supply layer. In order to further effectively reduce the noise due to cross-talk, the following relationship must be met: l > d where "l" is the minimum distance between the parallel conductors of the circuit-conductor layer, and "d" is the shorter distance between the circuit-conductor layer and the layer of the ground layer or the power supply layer adjacent to the circuit-conductor layer through the dielectric layer.

In the foregoing first, second, third and fourth embodiments, there are shown circuit boards of four-layers, six-layers, eight-layers and twelve-layers. The number of the circuit-conductor layers, the numbers of the power supply layers and the number of the ground layers of the respective circuit boards according to the first through fourth embodiments are listed in Table 1 below.

TABLE 1

|  | 4-layers | 6-layers | 8-layers | 12-layers |
| --- | --- | --- | --- | --- |
| circuit-conductor layer | 2 | 3 | 4 | 4 |
| power supply layer | 1 | 1 | 2 | 3 |
| ground layer | 1 | 2 | 2 | 5 |

Accordingly, users may select suitable circuit boards having reasonable numbers of conductive layers in view of the necessary numbers of the circuit-conductor layers, power supply layers and ground layers and the tolerable level of noise or the like. When the circuit board is constructed so as to meet the requirement that the circuit board has at least one circuit-conductor layer having on either side thereof a power supply layer or a ground layer through the dielectric layer, the effect of the invention is obtained. In this case, it is possible to effectively reduce noise due to cross-talk by decreasing the distance between the circuit-conductor layer and the power supply layer or the ground layer adjacent thereto through the dielectric layer. This effect is more remarkable in the case where the neighboring layer is the ground layer than the case where the neighboring layer is the power supply layer. In order to more effectively reduce the noise of cross-talk, the following relationship, l>d, should be met, where "" is the minimum distance between the parallel conductors in the circuit-conductor layer and "d" is the shorter distance between the circuit-conductor layer and the power supply layer or the ground layer adjacent thereto through the dielectric layer. As far as the above-described requirements are met, the circuit board may have any numbers of circuit-conductor layers, power source layers and ground layers, which are different from those listed in Table 1.

Figure 5:
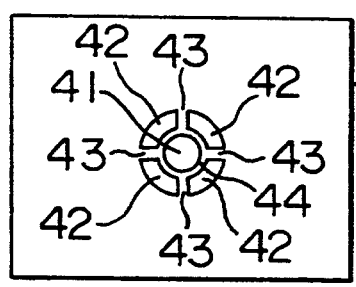
FIG. 5 is a view showing conventional thermal lands.
Figure 6:
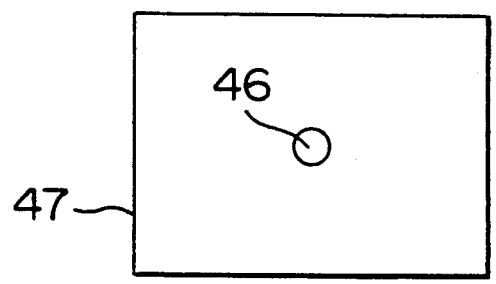
FIG. 6 is a view showing a fifth embodiment of the invention.

FIG. 6 shows a fifth embodiment of the invention. Conventionally, the ground layer is connected with the through-hole through thermal lands as shown in FIG. 5. Namely, the ground pin of the chip is inserted into the through-hole 41, and heat having conducted from the chip through the ground pin is transferred to the ground layer 45 through a land portion 44 and channel portions 43. According to this structure, the land portion 44 of the ground layer 45 is surrounded by cutout portions 42 that are used for suppressing the dissipation of heat during the soldering. The heat having conducted from the chip to the land portions 44 must be conducted only through the channel portions 43 which are narrow with high thermal resistance. As a result, it has not been sufficient to dissipate the heat from the chip to the ground layer.

In the case where the through-hole and the power supply layer are connected in the conventional manner, similarly to the case of the ground layer, since the thermal lands as shown in FIG. 5 are used for facilitating the soldering, it has not been sufficient to dissipate the heat, having conducted from the high temperature chip to the power source pin, to the power supply layer.

According to the present invention, in view of the above-noted defects, the thermal land is omitted as shown in FIG. 6, and the through-hole 46 and the ground layer 47 are connected to each other over the entire circumference of the through-hole 46.

With this structure, the thermal resistance at the joint or connecting portion between the through-hole and the ground layer is reduced in comparison with that of the conventional one, to thereby rapidly conduct the heat, having conducted from the ground pin, to the ground layer. On the other hand, the heat having conducted through the ground layer is transferred to a ground pin(s) of other chip(s), having a lower temperature than that of the ground layer, to cool the heated chip by the heat dissipation from surfaces of the other chip(s) and its pin(s). In addition, since the impedance at the joint portion between the through-hole and the ground layer is decreased in comparison with the conventional structure having the thermal land, it is possible to reduce the potential difference between the through-hole and the ground layer and to more effectively apply the ground potential to the ground pin.

This is also the case in the power supply layer. According to an embodiment of the present invention, similarly to the embodiment shown in FIG. 6, the through-hole and the power supply layer are connected to each other over the entire circumference of the through-hole. With such an arrangement, the thermal resistance at the joint portion between the through-hole and the power supply layer is considerably decreased in comparison with that of the prior art, whereby the heat that has been conducted from the high temperature chip to the power supply pin is rapidly conducted to the power source layer. On the other hand, it is also possible to conduct the heat, having been conducted from the power supply layer, to the power supply pin of a chip at a temperature lower than that of the power supply layer, to thereby dissipate the heat from the surfaces of the low temperature chip and its pin. In addition, the impedance at the joint portion between the through-hole and the power supply layer is smaller than that in the conventional case of providing the thermal land. Accordingly, it is possible to reduce the potential difference between the through-hole and the power supply layer and to apply the power supply potential to the power supply pin effectively.

As described above, the heat having conducted through the ground pin and the power supply pin from the highly heated chip rapidly conducts to the ground layer and the power supply layer. In addition, a part of the heat having conducted through the ground layer and the power supply layer and through the ground pin and the power pin of the electronic circuit chip having a lower temperature than that of the respective layers is dissipated from the surface of the low temperature chip and pin. It is possible to effectively cool the heated chip. Also, a good electrical connection is ensured.

This effect may also be obtained by the following structure. When "r" represents a radius of any one through-hole A of through-holes connected to the power supply layer and "2R" represents a distance between the center of the through-hole A and a center cf a through-hole B located nearest with respect to the through-hole A, a part of the power supply layer surrounded by a circle having the radius r about the center of the through hole A and by a circle having a radius R about the common center of the through hole A is all formed of material constituting the power supply layer or material having a high electric conductivity, such as solder or gold. In the case of the fifth or sixth embodiment, the heat having conducted to the ground layer(s) and/or power supply layer(s) is rapidly transferred to a cooling portion(s) provided at ends of the ground layer(s) and/or the power supply layer(s), and dissipated there as in the first embodiment.

The same effect can be also attained by the following structure. Namely, when "r" represents a radius of any one through-hole A of the through-holes connected to the ground layer and "2R" represents a distance between the center of the through-hole A and the center of the through-hole B nearest with respect to the through-hole A, a part of the ground layer surrounded by a circle having the radius r about the center of the through-hole A and by a circle having a radius R about the common center of the through hole A is all formed of material constituting the ground layer or material having a high electric conductivity, such as solder or gold.

Figure 13:
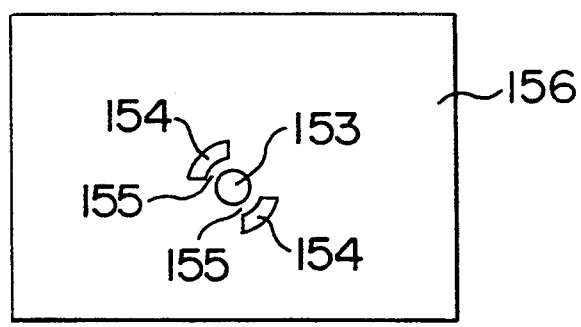
FIG. 13 is a view showing a sixth embodiment of the invention.

FIG. 13 shows a sixth embodiment of the invention. As described in conjunction with the fifth embodiment concerning the connection of the through-hole with the associated ground or power supply layer, in the conventional way of connection with the thermal lands, the thermal conduction between the through-hole land portions and the ground layer or the power supply layer is not sufficient. Therefore, if the thermal lands are dispensed with as in the fifth embodiment, then the heat is dissipated too rapidly from the through hole portion to the ground or power supply layer so that it will be sometimes difficult to perform the soldering of the parts or chips. Accordingly, on one hand, the thermal resistance is reduced to some extent, and on the other hand, in order to facilitate the soldering work, the through-hole 153 is separated from the ground layer 156 by cutout portions 154 which are smaller than those of the prior art, as shown in FIG. 13. With such an arrangement, it is possible to conduct the heat, having conducted from the highly heated chip through the ground pin, to the inner ground layer at a higher rate than in the conventional arrangement, and in addition, it is possible to carry out the soldering work more easily than in the arrangement of the fifth embodiment. Moreover, since the electrical resistance at the joint portion is smaller than the conventional one, it is possible to apply the ground potential to the ground pin more reliably than in the conventional system.

The method as shown in FIG. 13 may be equally applied to the connection between the power supply layer and the through-hole. The same effect may be obtained.

Figure 13A:
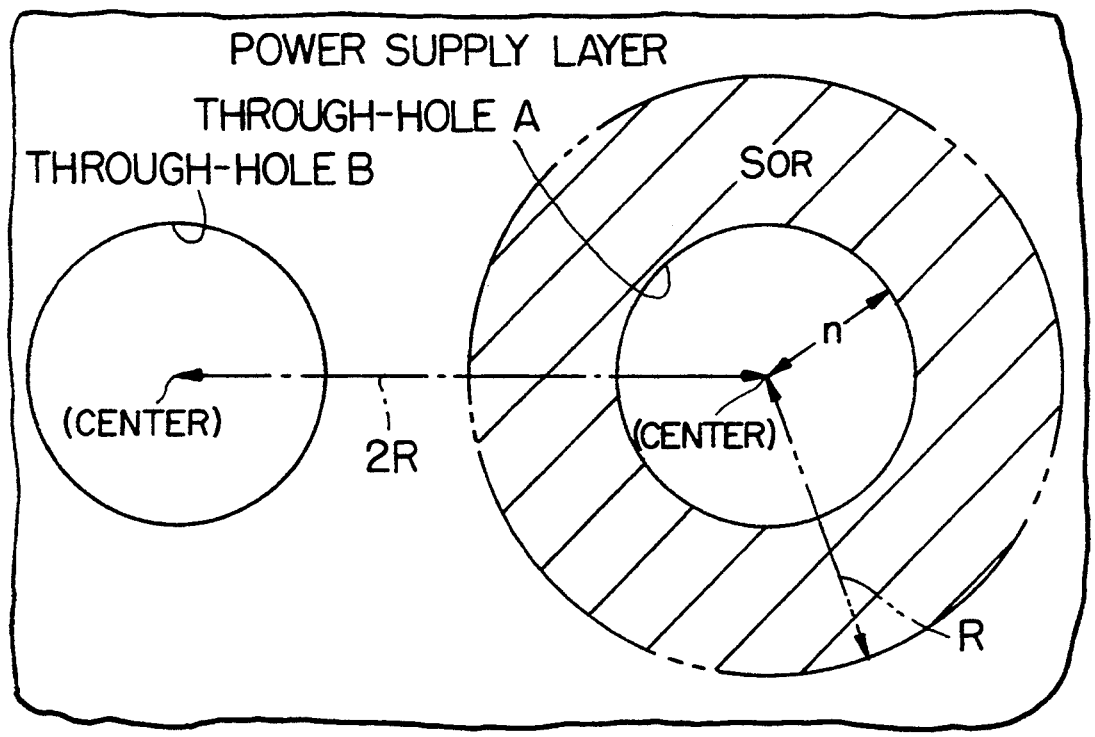
FIGS. 13a and 13b are diagrams illustrating a feature of the sixth embodiment.
Figure 13B:
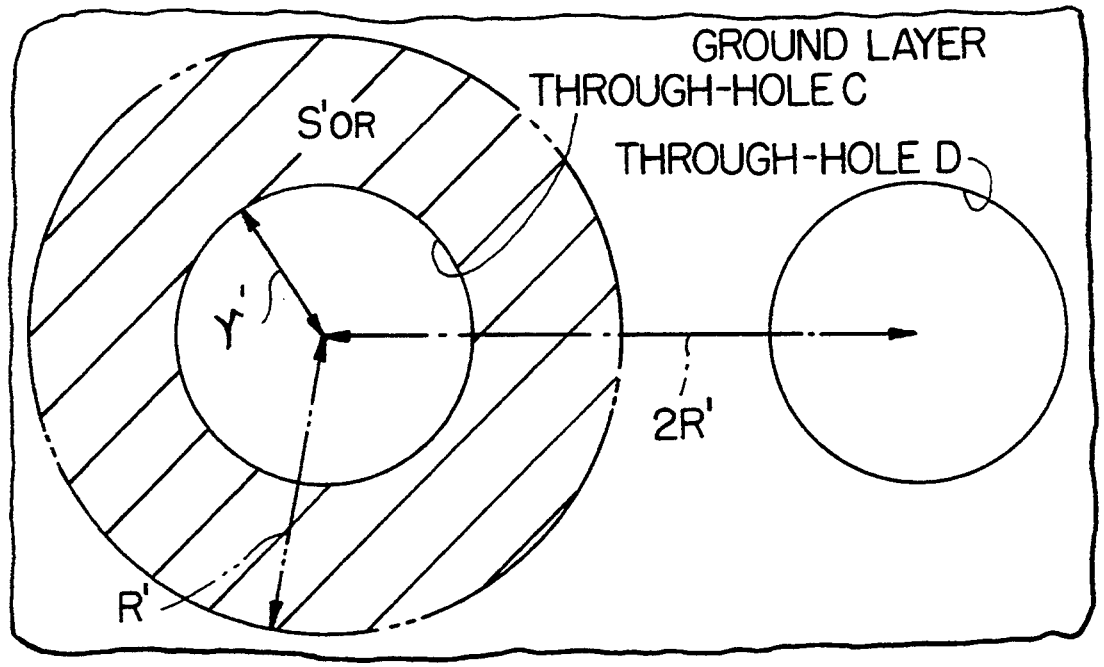

It is apparent for those skilled in the art that the area and shape of the cutout portions are not always the same as those shown in FIG. 13, but it is sufficient that the thermal resistance at the joint portion is smaller than that of the prior art shown in FIG. 5 while larger than that of the fifth embodiment shown in FIG. 6. Namely, as will be explained with reference to FIGS. 13a and 13b and FIG. 15, the following relationship is preferred to be met:

$$S_1/S_0 \geq 0.5 \ (approximately)$$

where "$S_0$" is an area of a region $S_{OR}$ of the power supply layer located between a circle having a radius r about the center of any one through-hole A (FIG. 15) of throughholes connected to the power supply layer and a circle having a radius R about the common center of the through-hole A and "$S_1$" is an area occupied by the substance forming the power supply layer within the region $S_{OR}$, when "r" represents the radius of the through-hole A and "2R" represents the distance between the center of the through-hole A and the center of a through-hole B (FIG. 15) closest to the through-hole A. Similarly, as to through-holes connected to the ground layer, when "r'" is a radius of any one through-hole C connected to the ground layer and "2R'" represents the distance between the center of the through-hole C and the center of a through-hole D closest to the through-hole C, the following relationship is preferred to be met:

$$S_1'/S_0' \geq 0.5 \ (approximately)$$

where "$S_0'$" presents an area of a region $S_{OR}'$ of the ground layer surrounded by a circle having a radius r' about the center of the through-hole C and a circle having a radius R' about the common center of the through-hole C and "$S_1'$" represents the area occupied by the substance forming the ground layer within the region $S_{OR}'$.

As described above, the heat which is conducted from the highly heated chip to the ground pin and the power supply pin can be transferred to the ground layer and the power supply layer more rapidly than in the prior art. A part of the heat which is conducted to the ground layer and the power supply layer is dissipated from surfaces of the lower temperature chips and pin surfaces thereof through the ground pins and the power supply pins at lower temperatures than those of the ground layer and the power supply layer, to thereby effectively cool the heated chips, and a good electrical connection is ensured. In addition, the soldering work is performed better and easier than in the fifth embodiment.

In the foregoing first through sixth embodiments, the cooling effect is attained by conduction through the ground pins and the power supply pins. According to a seventh embodiment of the present invention, the ground and power supply pins are respectively connected to the ground and power supply layers, and in addition, a pin(s) other than a pin to be used actually for processing the signals as power supply, ground or signal pin(s) and provided in the chip or extra pin(s) provided in the chip in excess is(are) connected appropriately to the power supply layer or the ground layer in such a manner as to reduce the thermal resistance. Namely, the pin which is electrically insulated or isolated from the circuit inside the circuit chip, input pin which is not used, or high impedance output or extra pin is connected, in a manner similar to the connection of the pin 9 or 11 in FIG. 1, to a suitable one of the ground layer (indicated by reference numeral 2 in an example of FIG. 1) and/or the power supply layer (indicated by reference numeral 3 in the example of FIG. 1) so as to reduce the thermal resistance. The connection may be carried out in accordance with the fifth embodiment or sixth embodiment.

According to the seventh embodiment, a Dart of the heat generated from the highly heated chip (corresponding to the element 12 in FIG. 1) is transferred through the ground pin (corresponding to the element 9 in FIG. 1), the power supply pin (corresponding to the element 11 in FIG. 1) the pin electrically insulated from the circuit inside the electronic circuit chip, the input not used, or high impedance output pin and/or extra pin to the ground layer (corresponding to the element 2 in FIG. 1) or the power supply layer (corresponding to the element 3 in FIG. 1). Thus, the heated chip(s) is (are) cooled. According to the seventh embodiment, in comparison with the case where only the ground and power supply pins are connected to the ground and power supply layers, respectively, the heated chip can be cooled more effectively since the heat conduction paths are increased for connecting the heated chips with the ground layer and/or the power supply layer.

In addition, a "part" of the material having a high thermal conductivity that is not limited to a so-called pin may be mounted electrically insulatively from the inner circuit to the highly heated electronic circuit chip, while the other part of the material may be connected to the ground or power supply layer through the through-hole or the like, to have a similar effect. The "part" herein is also referred to as a pin as far as the part is inserted the through-hole or the like.

Figure 7:
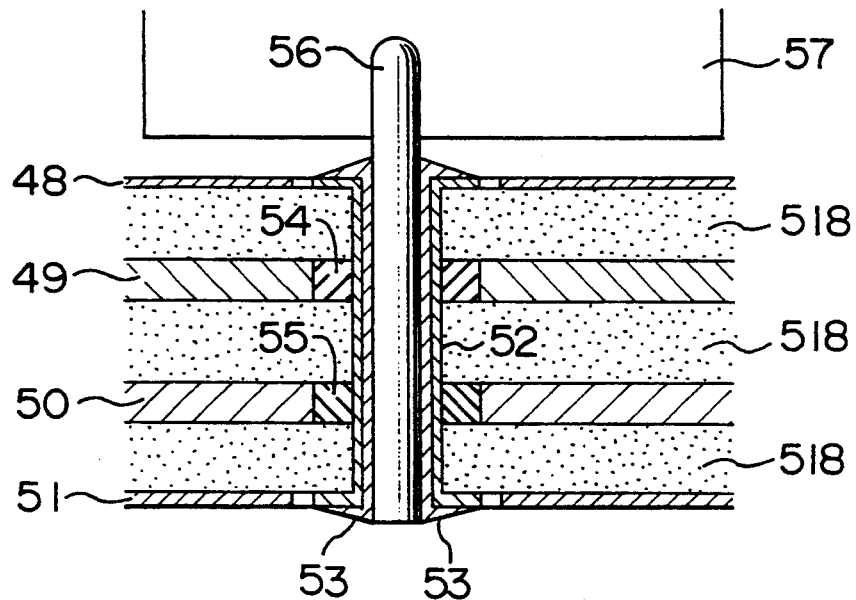
FIG. 7 is a cross-sectional view showing an eighth embodiment of the invention.

FIG. 7 shows an eighth embodiment of the invention. A signal pin 56 of an electronic circuit chip 57 is inserted into a through-hole 52 and is connected to circuit-conductor layers 48 and 51 soldering 53. A ground layer 49 and a power supply layer 50 are insulated by dielectric layers 518 from each other and from the circuit-conductor layers 48 and 51. The ground layer 49 is connected to the throughhole 52 through a dielectric material 54 having a high thermal conductivity. The power supply layer 50 is also connected to the through hole 52 through a dielectric material 55 having a high thermal conductivity. Although not shown, the power supply pin and the ground pin are connected to the associated power supply layer and ground layer in such a manner as to reduce the thermal conduction resistance. Furthermore, as desired, the pin that is electrically insulated from the inner electronic circuit, the input pin that is not under use, or high impedance output pin and/or the extra pin for heat dissipation or conduction may be connected to a suitable one of the ground layer and the power supply layer in such a manner as to reduce the heat resistance as in the seventh embodiment.

In the thus arranged circuit board, although a predetermined signal is transferred between the signal pin 56 and the circuit-conductor layers 48 and 51, the signal is not transferred to the ground layer 49 and the power supply layer 50 because the signal pin 56 is insulated from the ground layer 49 and the power supply layer 50. Inversely, an electrical signal is not transferred from these layers 50, 56 to the signal pin 56. However, as the heat resistances between the pin 56 and the ground and power supply layers 49, 50 are small, even in the case where the electronic circuit chip 57 is of the highly heated type, a part of the heat from the chip 57 is transferred through the pin 56 and then conducts through the thermally conductive dielectric materials 54 and 55 to the ground layer 49 and the power supply layer 50, to thereby cool the chip 57. On the other hand, in the case where the electronic circuit chip 57 is not highly heated, the heat from a highly heated chip conducts through the ground layer and the power supply layer to the thermally conductive dielectric materials 54, 55 and then to the pin 56 of a not-heated chip 57. The heat is dissipated from the surface of the signal pin 56 and the chip 57. In any case, the above-described associated components of the circuit board as a whole are contributable to the cool-down of the chips. In the eighth embodiment, in addition to the ground pin, the power supply pin, the pin that is insulated from the inner electronic circuit, the input pin that is not used, the high impedance output pin, and the extra pin for heat conduction, the signal pin is also used for heat conduction or dissipation paths, as desired. The eighth embodiment is thus effective to reduce the thermal resistance between the chips and the ground or power supply layer of the circuit board and to cool the heated chip in comparison with a case where the signal pin is not used for heat dissipation. In the case where the power supply layer 50 and the ground layer 49 are interchanged with each other, the invention may also be applied thereto with the same effect to cool the chips.

In addition to the eighth embodiment, there is a ninth embodiment shown in FIG. 8 in which the signal pin and the ground or power supply layer are electrically insulated but the heat conduction is satisfactory therebetween. In FIG. 8, the ground layer 59 and the power supply layer 60 are electrically insulated by dielectric layers 519 from each other and from the circuit-conductor layers 58 and 61. The ground layer 59 and the power supply layer 60 are electrically insulated from the respective signal pins 507, 66 and through thermally conductive dielectric materials 505, 64 and 68. Thus, the heat is conducted thereamong. Land portions 516, 62, 67, 517, 65 and 70 are provided on the circuit layers 58 and 61, with the land portions 516 and 517 being electrically connected to the signal pin 507 through solderings 504 and 506. The land portion 62 is connected to the signal pin 66 through a solder portion 63. The land portion 70 is connected to the signal pin 71 through a solder portion 69. In addition, although not shown in FIG. 8, the ground pin and the power supply pin are connected to the associated layers in such a manner as to reduce the thermal resistance therebetween. Furthermore, as desired, the pin that is electrically insulated from the inner electronic circuit, the input pin that is not used, and the high impedance output pin may be connected to a suitable one of the ground and power supply layers, in such a manner as to reduce the thermal resistance, as proposed in the seventh embodiment.

In the thus arranged circuit board, because the ground pin, the power supply pin, the pin that is electrically insulated from the inner electronic circuit, the input pin that is not in use, and the high impedance output pin, if desired, serve as the heat conduction or dissipation paths, and because the signal pin may also serve as the heat conduction path, the heat conduction between the electronic circuit chip 72 and the ground layer 59 or the power supply layer 60 may be attained in a good condition in the same manner as in the eighth embodiment. Accordingly, the circuit board according to this embodiment is effective for cooling the electronic circuit chips.

It will be appreciated that the thermally conductive and electrically insulating connection of the signal pin with the ground or the power supply layer may be any one of the connections for the signal pins 507, 66 and 71 shown in FIG. 8 or combination thereof. In addition, even if the power supply layer 60 and the ground layer 59 are interchanged by each other, the connection proposed herein may be also applied to effectively cool the chips.

Figure 12:
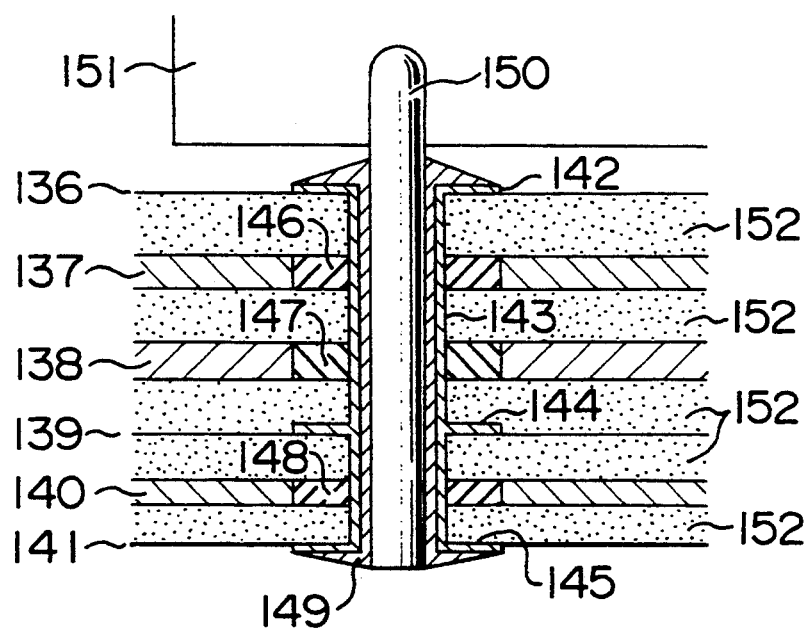
FIG. 12 is a cross-sectional view showing a tenth embodiment of the invention.

FIG. 12 shows a tenth embodiment of the invention. In FIG. 12, ground layers 137 and 140 and a power supply layer 138 are insulated from one another and from circuit-conductor layers 136, 139 and 141 by insulative or dielectric layers 152. The ground layers 137 and 140 and the power supply layer 138 are electrically insulated from through-hole 143 by means of thermally conductive dielectric materials 146, 148 and 147. These components 137, 140, 138, 143 are thus thermally conductive with each other. A signal pin 150 is inserted into the through-hole 143 and is connected to land portions 142, 144 and 145 through solder 149. Although not shown in FIG. 12, the ground pin and the power source pin are connected to the associated layers in such a manner as to reduce the thermal resistance. As desired, the pin that is electrically insulated from the inner electronic circuit, the input pin that is not in use, and the high impedance output pin may be connected to a suitable one of the ground and power supply layers in such a manner as to reduce the thermal resistance as in the seventh embodiment.

In the thus constructed circuit board, because the ground and power source pins, the pin that is electrically insulated from the inner electronic circuit, the input pin that is not used, and the high impedance output pin as well as the signal pin may be used as the heat conductive paths, the thermal conduction may be well attained between the electronic circuit chip 151 and the ground layers 137, 140 and/or the power supply layer 138 in the same manner as that of the eighth embodiment. Accordingly, the circuit board according to the tenth embodiment can be effectively used for cooling the electronic circuit chips.

In contrast with the eighth embodiment shown in FIG. 7, a circuit-conductor layer is provided in the interior of the circuit board according to this embodiment, under the condition where the signal pins are electrically insulated from the ground and power supply layers while being connected to one another with a good thermal conduction. This structure or method can be applied in the case where the number of the circuit-conductor layers, ground layers and power supply layers is increased or the order of the layers are different from that of FIG. 12, such that the signal pin is electrically insulated from the power supply and ground layers, while these components may be effectively connected to each other with a good heat conduction, thereby providing a circuit board capable of effectively cooling the electronic circuit chips thereon.

Figure 16:
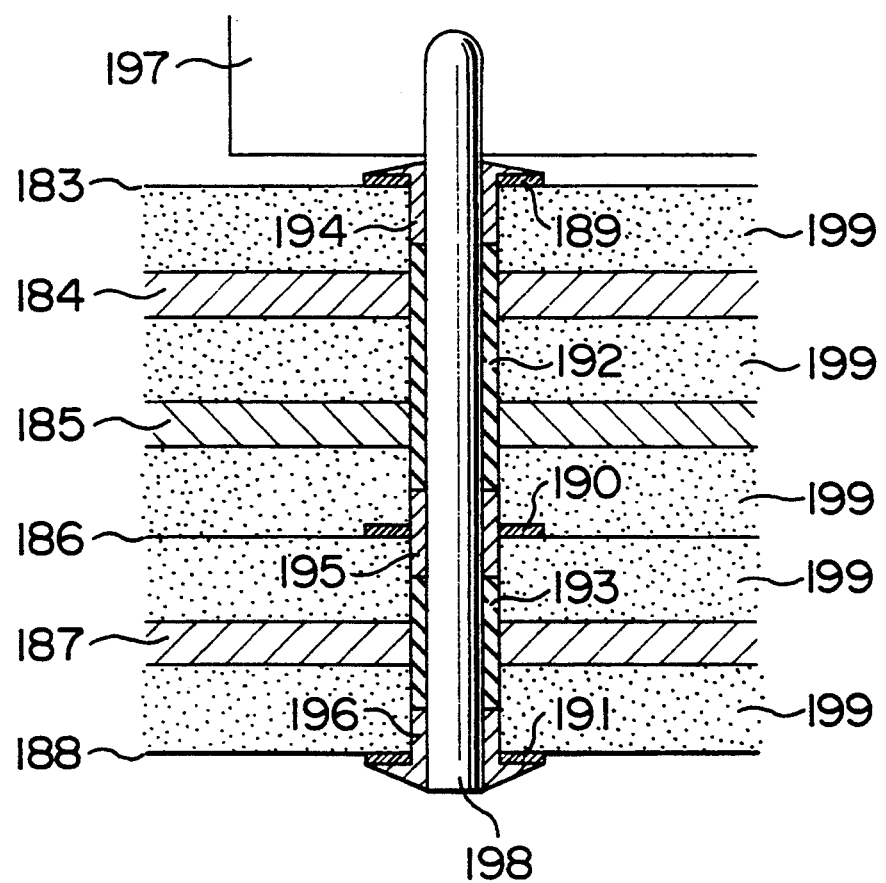
FIG. 16 is a cross-sectional view showing an eleventh embodiment of the invention.

FIG. 16 shows an eleventh embodiment of the invention. In FIG. 16, ground layers 184, 187, power supply layer 185 and circuit-conductor layers 183, 186 and 188 are insulated from one another by dielectric layers 199. A signal pin 198 of an electronic circuit chip 197 is connected to lands 189, 190 and 191 on respective circuit-conductor layers 183, 186 and 188 through solder portions 194, 195 and 196. Ground layers 184, 187 and power supply layer 185 are electrically insulated from the signal pin 198 but thermally conductive therewith by means of thermally conductive dielectric materials 192 and 193. In addition, although not shown in FIG. 16, the ground pin and the power supply pin are connected to the associated layers in such a manner as to reduce the thermal resistance. As desired, a pin that is electrically insulated from the inner electronic circuit, an input pin that is not used, the high impedance output pin and an extra pin for heat conduction may be connected to a suitable one of the ground and power supply layers in such a manner as to reduce the thermal resistance as in the seventh embodiment.

In the thus constructed circuit board, the ground pin and the power supply pin serve as the thermal paths. As desired, the pin that is electrically insulated from the inner electronic circuit, the input pin that is not used and the high impedance output pin may also serve as the heat paths. In addition, the signal pin also serves as the heat path. Therefore, the heat conduction between the electronic circuit chip 197 and the ground layers 184 and 187 as well as the power supply layer 185 can be well performed as in the ninth embodiment. Consequently, the circuit board according to this embodiment can be used to cool the electronic circuit chip effectively.

In contrast with the ninth embodiment where there is no circuit-conductor layer within the interior of the circuit board, this embodiment is directed to the case where the circuit-conductor layer is interposed within the circuit board where the heat conduction may be well performed between the signal pin and the ground and power supply layers while the signal pins are electrically insulated from the ground and power supply layers.

Similarly, it is possible to connect the signal pin with the power supply layer and the ground layer with high, thermal conduction while electrically insulating or isolating these components, thereby providing a circuit board capable of effectively cooling chips thereon, even if the numbers of the circuit-conductor layers, ground layers and power supply layers are increased or the superposed order of layers is changed from those shown in FIG. 16.

Figure 9:
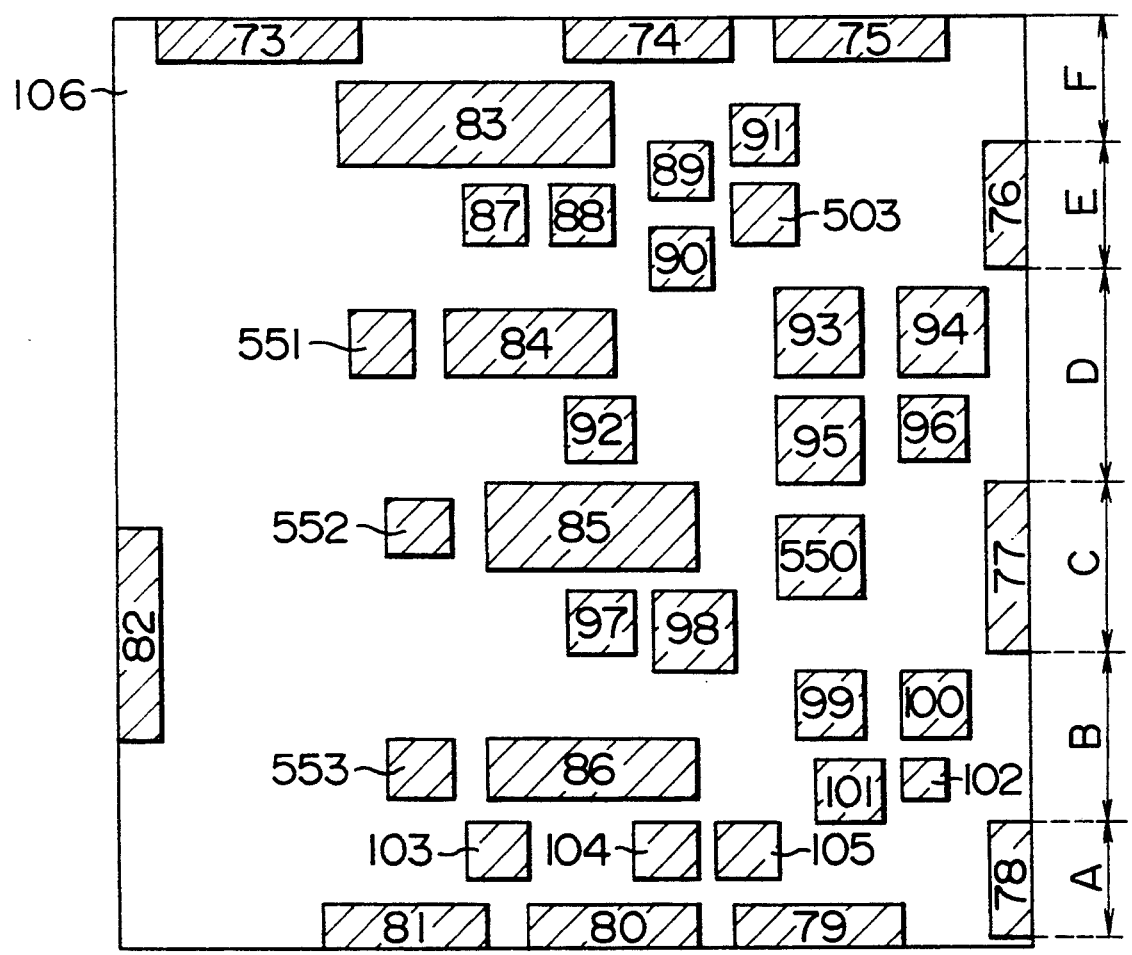
FIGS. 9, 10 and 14 are views showing a twelfth embodiment of the invention.

FIG. 9 shows a twelfth embodiment of the invention. In the twelfth embodiment, as shown in Fig. 9, on a circuit board 106, there are arranged connectors 73 to 82, ZIP-type memories 83 to 86, highly heated electronic circuit chips 87 to 105, 503 and 550 to 553 and not-highly-heated electronic circuit chips (not shown in FIG. 9).

Figure 10:
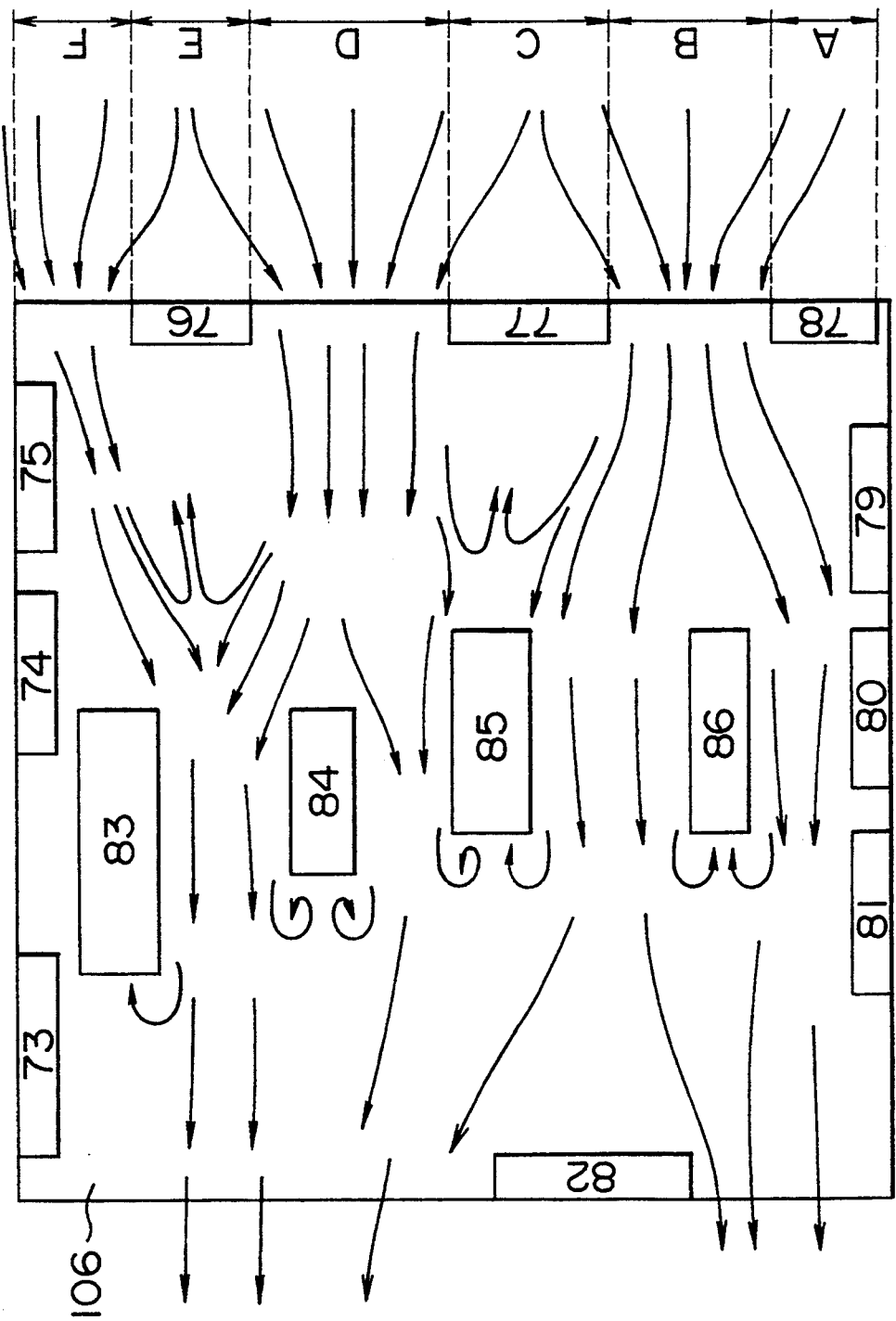
Figure 14:
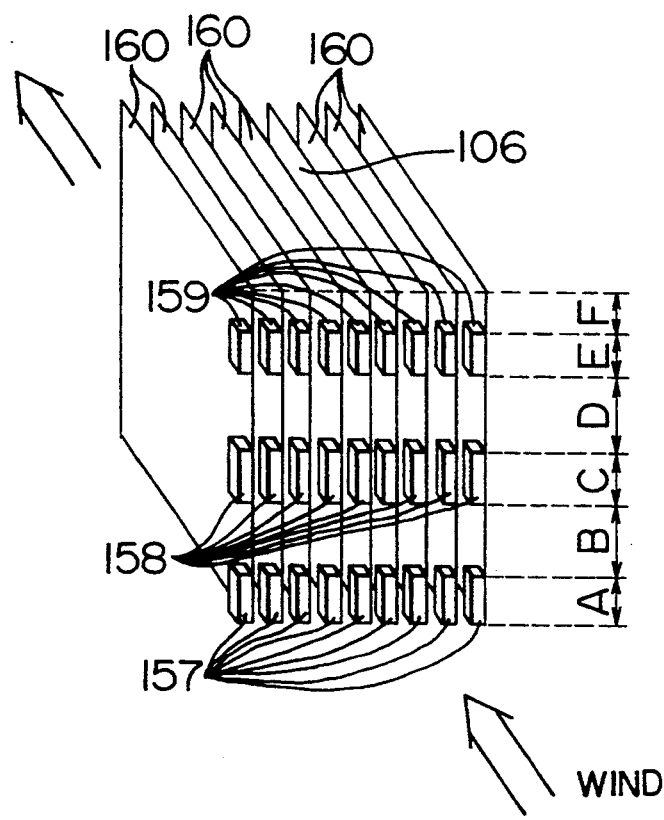

In order to cool the thus arranged chip-mounted circuit board, cooling fluid such as air is caused to flow from the right (on the side of the connectors 76 to 78) to the left (on the side of the connector 82) by a fan or the like. In general, in a circuit board apparatus or system where plural or multiple circuit boards are incorporated, it is preferable to increase the mounting density of circuit boards as high as possible for the reasons that the delay or lag of signals between the circuit boards and influence of noise should be prevented or minimized; signal lines should be shortened; and the system should be made compact. In the case where the chip-mounted circuit boards as shown in FIG. 9 are mounted at a high density as shown in FIG. 14, when the fluid is caused to flow in the direction indicated by the arrow in FIG. 14, the clearances between the connectors 157, 158 and 159, corresponding to connectors 76, 77 and 78, on one circuit board 160 and the adjacent circuit boards 160 are smaller than the distance between the two adjacent circuit boards 160, 160 per se. As a result, the flow resistance of fluid is increased at these portions A, C and E in FIG. 14. In other words, the flow of fluid is limited or throttled to the parts B, D and F in FIG. 14 so that the flow rate of the fluid passing through the parts B, D and F is increased after the throttle effect. FIG. 10 schematically shows the flow of fluid on or along the circuit boards 106 shown in FIG. 14. In FIG. 10, the connectors 73 to 82, and the ZIP memories 83 to 86 have relatively large heights from the parts-mounted surface of each circuit board 106, thereby reducing clearances from the adjacent circuit board. Accordingly, the connectors 73 to 82 and the ZIP memories 83 to 86 act as obstacles against the flow of fluid. As a result, the fluid is caused to flow on and along the parts-mounted surface of the circuit board 106 as indicated by the arrows in FIG. 10. Accordingly, in the case where the high temperature electronic circuit chips 87 to 105, 503 and 550 to 553 are mounted on the thus arranged circuit board, these heat-generating components are arranged as shown in FIG. 9. Although not shown in FIG. 9, the low temperature chips which do not generate much heat are arranged on spaces other than those for the high temperature chips.

In the chip-mounted circuit board in which the parts are thus arranged and mounted, the chips 93 to 96 are subjected to the flow collision of the fluid that has been throttled to increase its flow rate at the region D between the connectors 76 and 77, whereas the chips 99 to 102 are subjected to flow collision of the fluid that has been throttled to increase its flow rate at the region B between the connectors 77 and 78. In general, when the heated member is cooled by fluid, if the flow rate of the fluid is increased, higher heat transfer rate is obtained to increase the cooling effect. Accordingly, these chips are effectively cooled in comparison with the case where the fluid is not throttled by the connectors 76 to 78.

In addition, at a region where the high temperature chips 89 to 91 and 503 are arranged, these chips impede the fluid that has passed through the regions D and F to generate turbulence. At a region where the high temperature chip 550 is arranged, the chip 550 impedes the fluid that has passed through the regions B and D to generate turbulence. At a region where the high temperature chips 551 to 553 are arranged, the turbulence is generated. Accordingly, at these positions or regions the heat transfer between the chip surfaces and the fluid is kept under the turbulence heat transfer condition, so that the heat transfer rate is considerably increased in comparison with the case where no turbulence is generated. Thus, the chips are effectively cooled.

In addition, the high temperature chips 87 and 88 impedes the fluid that has been throttled between the ZIP memories 83 and 84 to increase its flow rate, whereas the high temperature chip 92 impedes the fluid that has been throttled between the ZIP memories 84 and 85 to increase its flow rate. The high temperature chips 97 and 98 impede the fluid that has been throttled between the ZIP memories 85 and 86 to increase its flow rate, whereas the high temperature chips 103 to 105 are exposed to the fluid that has been throttled between the ZIP memory 86 and the connectors 79 to 81 to increase its flow rate. Accordingly, all of the high temperature chips 87, 88, 92, 97, 98, and 103 to 105 are exposed to the high speed fluid flow to be cooled effectively in comparison with the case where the connectors or the ZIP memories are not arranged as shown in FIG. 9.

As described above, in the twelfth embodiment of the invention shown in FIG. 9, the obstacles against the flow of fluid such as the connectors and ZIP memories that are necessarily arranged on the circuit boards are rather positively utilized whereby the chips may be effectively cooled by the cooling fluid that has the increased flow rate due to the throttle effects of these components and by the turbulence generated by these components. In addition, the fact that the total surface area of the chip-mounted circuit board is increased to be greater than that of the circuit board on which no chips are mounted and the fact that the turbulence is generated by the chips per se on the circuit board contributes to the cooling effect in this embodiment.

It is to be noted that the obstacles for controlling the flow of fluid is not limited to the connectors and ZIP memories, and any part that should be inherently arranged on the circuit board may be used as the obstacle.

The cooling fluid may be an electrically insulating gas or liquid. In the case where the cooling fluid is the liquid, the circuit board may be dipped or submerged into the liquid.

Figure 11:
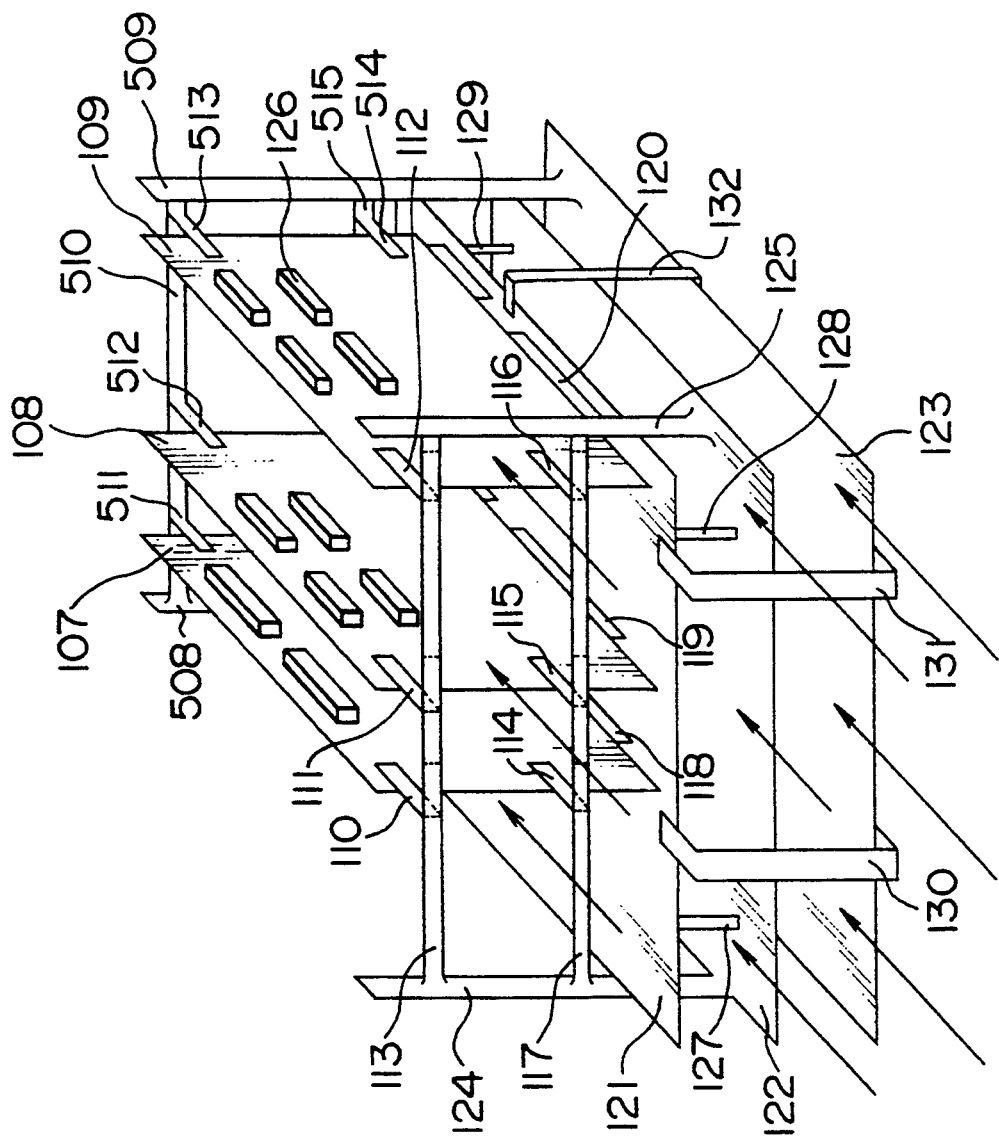
FIG. 11 is a view showing a thirteenth embodiment of the invention.

FIG. 11 shows a thirteenth embodiment of the invention. In FIG. 11, circuit boards 107 to 109 are connected to a mother board 121 through connectors 118, 119 and 120, respectively. Ground layers of the circuit board 107 are connected to conductive plates 113 and 117 through conductive plates 110 and 114. Power supply layers of the circuit board 107 are connected to a conductive plate 510 through a conductive plate 511 and are connected to a conductive plate 515 through another conductive plate (not shown in FIG. 11). Ground layers of the circuit board 108 are connected to conductive plates 113 and 117 through conductive plates 111 and 115. Power supply layers of the circuit board 108 are connected to the conductive plate 510 through a conductive plate 512 and are connected to the conductive plate 515 through another conductive plate (not shown in FIG. 11). Ground layers of the circuit board 109 are connected to conductive plates 113 and 117 through conductive plates 112 and 116. Power supply layers of the circuit board 109 are connected to the conductive plates 510 and 515 through conductive plates 513 and 514. All of the conductive plates are made of electrically and thermally conductive material and are connected to the associated conductive plates or layers in a manner to reduce the thermal and electrical resistance. The ground layer(s) of the mother board 121 is connected through conductive plates 127, 128, 129 and the like to a ground plate 122. The power supply layer(s) of the mother board 121 is connected through conductive plates 130, 131, 132, and the like to a power supply plate 123. The ground plate 122 and the power supply plate 123 are made of electrically and thermally conductive material. The conductive plates 113 and 117 are connected to the ground plate 122 through the conductive plates 124 and 125. The conductive plates 510 and 515 are connected to the power supply plate 123 through the conductive plates 508 and 509. The cooling fluid is caused to flow from the front side to the rear side as indicated by the arrows in FIG. 11. A suitable number of high temperature chips 126 are mounted on the respective circuit boards.

Any one or combination of the structures according to the first through twelfth embodiments may be used for the respective circuit boards 109.

In the thus arranged system or circuit board apparatus, the heat generated from the electronic circuit chips mounted on the circuit boards 109, for example, is dissipated by the following steps.

(a) The heat conducts to the surface of the chip and is removed by the fluid flowing along the chip surface.

(b) The heat conducts to the pin projecting from the heated chip and is removed at the pin surface.

(c) The heat conducts from the heated chip to the inner ground layer and/or power supply layer through the pins that are connected to the ground layer and/or power supply layer in such a manner as to reduce the thermal resistance, and further conducts to the surface of the low temperature chip which is at a lower temperature than that of the ground/power supply layer(s). Then, the heat is dissipated from the chip surface and the pin surface of the low temperature chip.

(d) The heat conducts from the heated chip to the inner ground layer and/or power supply layer through the pins that are connected to the ground layer and/or power supply layer in such a manner as to reduce the thermal resistance, dissipates all over the circuit board and further conducts gradually to the circuit board surface to be dissipated or removed therefrom.

(e) The heat conducts from the heated chip to the inner ground layer and further conducts to the conductive plates 113 and 117 through the conductive plates 112 and 116 and then conducts to the ground plate 122 through the conductive plates 124 and 125. The heat having conducted through this heat path is dissipated or removed from the surface of the ground plate and the respective surfaces of the conductive plates.

A part of the heat having conducted to the inner ground layer is transferred to the mother board 121 through the connector 120 and is further transferred to the ground plate 122 through the conductive plates 127 to 129 and other conductive plates. The heat that is transferred through this heat path is dissipated from the surfaces of the respective conductive plates, the surface of the mother board and the surface of the ground plate. In addition, if there is a circuit board (i.e., daughter board) at a temperature lower than that of the mother board 121, the heat also conducts thereto and is dissipated in the daughter board.

(f) The heat conducts to the inner power supply layer from the heated chip and is transferred to the conductive plates 510 and 515 through the conductive plates 513 and 514 and further conducts to the power supply plate 123 through the conductive plates 508 and 509.

The heat that is transferred through this heat path is dissipated from the surface of the respective conductive plates and the surface of the power supply plate 123.

In addition, a part of the heat which is conducted to the inner power supply layer is transferred to the mother board 121 through the connector 120 and conducts to the power supply plate 123 through the conductive plates 130 to 132 and other conductive plates. The heat dissipated through this heat path is removed from the surface of the respective conductive plates, the surface of the mother board and the surface of the power supply plate. Furthermore, if there is a daughter board at a temperature lower than that of the mother board, the heat is also transferred thereto and is dissipated in the daughter board.

(g) In addition, there are cooling effects due to the radiation and convection serving to dissipate or remove heat from the respective chips, pins, conductive plates, circuit boards, mother board, power supply plates and ground plate.

As described above, the electronic circuit chips on the circuit board 109 can be cooled. The electronic circuit chips on the circuit boards 107 or 108 can be cooled in the same manner.

In the circuit board apparatus or system shown in FIG. 11, the power is supplied to the mother board 121 through the power supply layer and the ground layer of the mother board from the power supply plate 123 and the ground plate 122 connected to a power supply unit (not shown in FIG. 11). Since the power supply potential and the ground potential can be stabilized to serve as the reference for the system, on the power supply plate 123 and the ground plate 122, it is possible to stabilize the power supply potential and the ground potential in the mother board 121 as well as in the daughter boards 107 to 109.

The structures in accordance with the first through fourth embodiments are also applied to the mother board 121. Accordingly, also in the mother board, multiple power supply and ground layers are provided in the same manner as the boards 107 to 109, i.e., daughter boards. It is therefore possible to reduce impedances of the power supply ground layers per se and to suppress the change in power supply potential and ground potential, during the operation including the high frequency components, within the circuit boards.

In addition, in the mother board 121, the heat from the high temperature chips and the high temperature connector pins are spread through the inner ground layer and power supply layer over the entire circuit board in the same manner as in the daughter boards 107 to 109. Thus, it is possible to make the temperature uniform over the mother board.

Although, in FIG. 11, the number of the daughter boards that are connected to the mother board is three, the number of the daughter boards may be increased. In this case, the same effect can be attained.

It is preferable to shorten or minimize the lengths of the path connecting the mother board 121 with the ground plate 122 and the path connecting the mother board 121 with the power supply plate 123 for cooling the chips effectively and for stabilizing the ground power supply potentials as well as the signals in the circuit boards.

Although, in this embodiment, the ground plate 122 and the power supply plate 123 are arranged below the mother board 121, there is no limitation in the numbers and locations thereof as far as the above-noted conditions are met.

Furthermore, it is possible to provide corrugations or fins on the surfaces of the ground plate 122 and the power supply plate 123. This may enhance the cooling effect of the chips.

In the arrangement shown in FIG. 11, although the ground layers of the respective circuit boards and the ground plate 122 are connected to each other through the conductive plates 110 to 117, 124 and 125, and the power supply layers of the respective circuit boards and the power supply plate 123 are connected to each other through the conductive plates 510 to 515, 508 and 509 and other conductive plates, there is no absolute necessity to connect both the ground plate 122 and the the power supply plate 123 to the ground layers and the power source layers, respectively. Accordingly, it is also possible to connect only the ground layers with the ground plate 122 or to connect only the power supply layers with the power supply plate 123.

The locations of the respective conductive plates are not always limited to that shown in FIG. 11. It is possible to select the location(s) and the suitable number thereof as desired. In addition, if the mother board and the daughter boards of the circuit board apparatus are structured to be circuit boards and chip-mounted circuit boards according to the embodiments of the invention, the foregoing effects may be obtained more effectively.

Figure 15:
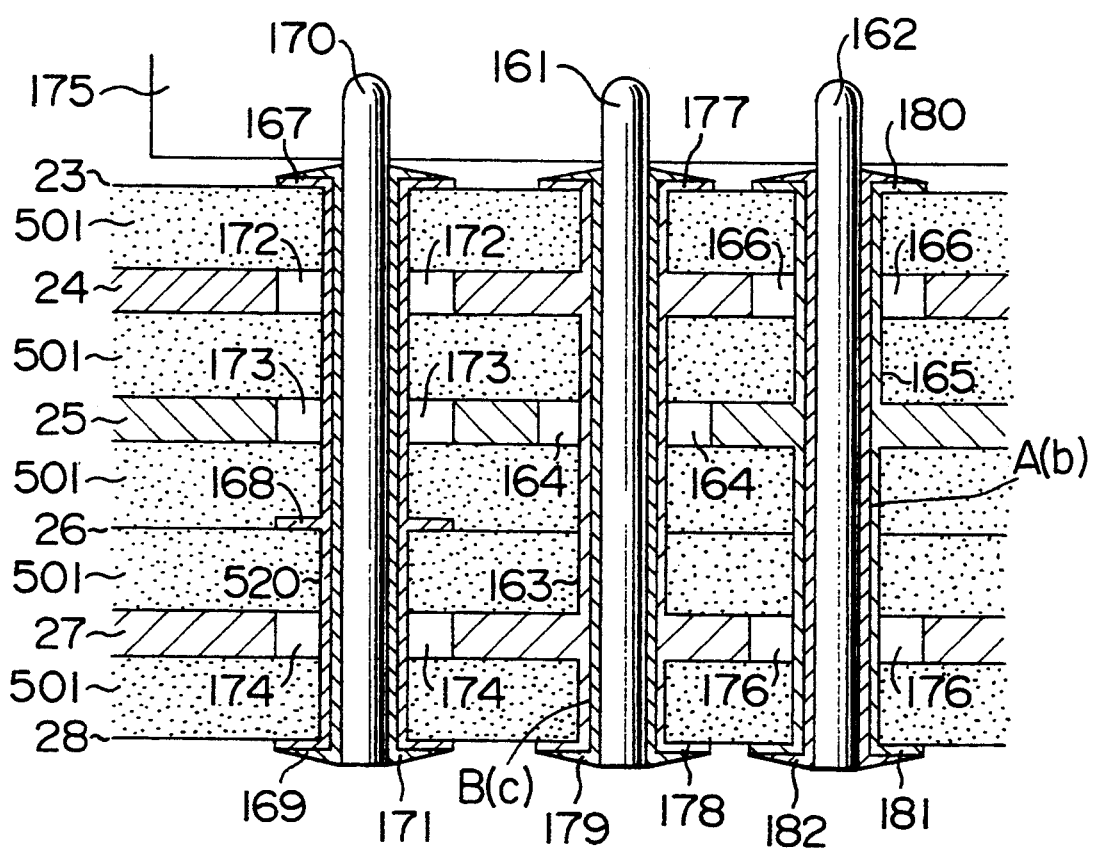
FIG. 15 is a cross-sectional view showing a fourteenth embodiment of the invention.

A fourteenth embodiment of the invention will now be explained with reference to FIG. 15. The circuit board according to this embodiment is composed of circuit-conductor layers 23, 26 and 28, ground layers 24 and 27, a power supply layer 25 and dielectric layers 501. The dielectric layers 501 are made of material (e.g., ceramics) that is superior in electric insulation and is superior in thermal conductivity to epoxy resin. The circuit-conductor layer 23 is located at a side of the circuit board for receiving electronic parts and the circuit layer 28 is located at a side of the circuit board for the soldering. FIG. 15 shows a connection of the circuit board according to this embodiment with an electronic circuit chip(s) to be mounted on the circuit board, through a ground pin(s), power supply pin(s) and signal pin(s) thereof each extending from the chips.

The through-hole 520 where the signal pin 170 of the electronic circuit chip 175 is inserted is connected to land portions 167 to 169 located in the respective circuit-conductor layers 23, 26 and 28. The electrically insulating or dielectric layers 501 with a high thermal conductivity are in contact with the through-hole 520 thereby enabling the good heat conduction therebetween. The ground layers 24 and 27 and the power supply layer 25 are also in contact with the electrically insulating (dielectric) layers 501 with high thermal conductivity thereby enabling good heat conduction therebetween. The ground layers 24 and 27 are insulated from the through-hole 520 by the spaces or escape holes 172 and 174, and the power supply layer 25 is insulated from the through-hole 520 by the space or escape hole 173.

The through-hole 163 where the ground pin 161 is inserted are electrically connected to the land portions 177 and 178 located in the circuit-conductor layers 23 and 28. The insulating layers 501 and the through-hole 163 are in contact with each other and good heat conduction therebetween is ensured. The ground layer 24 and 27 are electrically connected to the through-hole 163. The power supply layer 25 is insulated from the through-hole 163 by the space or escape hole 164.

The through-hole 165 where the power supply pin 162 is inserted is electrically connected to the land portions 180 and 181 in the circuit-conductor layers 23 and 28. The power supply layer 25 is electrically connected to the through-hole 165. The insulating layers 501 are in contact with the throughhole 165 to thereby enable the good heat conduction therebetween. The ground layers 24 and 27 are insulated from the through-hole 176 by the spaces or escape holes 166 and 176.

In the thus constructed chip-mounted circuit board, the heat generated from the electronic circuit chip 175 mounted on the circuit board is dissipated as follows. A part of heat generated from the chip conducts to the chip surface 175 and is removed therefrom. The remaining part of the heat conducts to the signal pin 170, the ground pin 161 and the power supply pin 162, where a part of the heat is removed from the pin surfaces. The heat which is conducted through the pin 170 is transferred to the insulating layers 501 through the solder 171 and the through-hole 520. Since the insulating layers 501 are electrically insulative but thermally conductive, the heat resistance between the through-hole 520 and the insulating layers 501 is low in comparison with the case where the insulating layers 501 are not thermally conductive. Thus, the heat conduction therebetween can be well performed.

The heat which is conducted through the pin 161 is transferred through the solder portion 179 and the throughhole 163 to the ground layers 24 and 27 that are electrically connected thereto and is also transferred to the adjacent insulating layers 501. Since the insulating layers 501 are electrically insulating but thermally conductive, the thermal resistance between the throughhole 163 and the insulating layers 501 is low in comparison with the case where the insulating layers 501 are not thermally conductive. Thus, the thermal conduction therebetween can be well performed.

The heat having conducted through the pin 162 is transferred through the solder portion 182 and the throughhole 165 to the power supply layer 25 electrically connected to the pin 162 and is also transferred to the adjacent insulating layers 501.

Since the insulating layers 501 are electrically insulating but thermally conductive, the heat resistance between the through-hole 165 and the insulating layers 501 is low in comparison with the case where the insulating layers 501 are not thermally conductive. Thus, the heat conduction therebetween can be well performed.

The heat that has been transferred to the ground layers 24 and 27, the power supply layer 25 and the dielectric layers 501 is dissipated along the following paths.

Firstly, a part of the heat conducts from the ground layers 24 and 27, the power supply layer 25 and the dielectric layers 501 in a thickness direction of the circuit board and reaches the surfaces of the circuit board, where the heat is removed. Since the dielectric layers 501 are thermally conductive, the heat rapidly conducts to the circuit board surfaces in comparison with the case where the dielectric layers are not thermally conductive. Thus, the heat is well dissipated.

Secondly, a part of the heat conducts to the ground pin, power supply pin and signal pin, which are at a temperature lower than that of the ground layers 24, 27, power supply layer 25 and dielectric layers 501, and is removed from the surface of the pins and the surface of the chips having the pins. If the dielectric layers (501) are not thermally conductive, the heat is mainly transferred through path extending along the ground layer and the power supply layer, subsequently through the ground pin and power supply pin and then to the chip surface. However, since the dielectric layers 501 are made of thermally conductive material in this embodiment, in addition to the heat path above, there are other effective heat paths extending from the dielectric layers 501, through the ground pin and the power supply pin to the chip surface, and extending from the dielectric layers through the signal pin to the chip surface. The numbers of the parallel heat dissipation paths are increased thereby promoting the heat conduction to well perform the cooling.

Thirdly, a part of the heat conducts to the ground layer, the power supply layer and the dielectric layers and is removed by cooling means provided at the ends of these layers. The heat quantity that reaches the cooling means through the dielectric layers according to the present embodiment is larger than that in the case where the dielectric layers are made of thermally non-conductive material. Thus, it is possible to effectively cool the heated chips.

In addition, since the ground layers and the power supply layer are arranged in a multilayer form as shown in FIG. 15, it is possible to reduce the noise due to cross-talk as in the third embodiment. The other improvements to promote this effect described in the third embodiment can be equally applied to the fourteenth embodiment.

Furthermore, as the ground layers and the power supply layer are arranged in the multilayer form as shown in FIG. 15, it is possible to arrange the ground layers and the power supply layer, which are thermally conductive members, in the vicinity of the surface of the circuit board at a greater proportion than in the case where each the ground layer and the power source layer having the same thickness as the total thickness of the corresponding layers are arranged in a single layer manner, this arrangement is more effective for cooling at the surface of the circuit board than the single layer structure. This is also the case if the dielectric layers 501 are made of thermally non-conducting material.

Moreover, because the power supply layer and the ground layers are provided in the multilayer form, it is possible to reduce the impedances of the power supply layer and the ground layers and to reduce, within the circuit board, the change of ground potential and power supply potential in the high frequency operation.

In addition, because, in this embodiment, the heat generated from the electronic circuit chip 175 is transferred not only through the inner ground layers 24 and 27 and the power supply layer 25 but also through the heat conductive dielectric layers 501 over the entire circuit board, it is possible to effectively make the temperature uniform over the circuit board in comparison with the case where the dielectric layers 501 are made of thermally non-conducting material.

Furthermore, although, in this embodiment, the regions 172 to 174, 164, 166 and 176 are empty spaces or escape holes, it is also possible to fill these regions with material which is not electrically conductive but is thermally conductive. In this structure, these dielectric parts contribute to the heat conduction, to thereby enhance the cooling effect.

The embodiment shown in FIG. 3 is an example where the circuit board is composed of six electrically conductive layers. In this embodiment, the ground layer or the power supply layer is provided adjacent to the circuit-conductor layer through the thermally conductive dielectric layers. So long as these conditions are met, the effect of the present invention can be obtained even if the layer superposition order is different from that shown in FIG. 3 and the number of the layers is different from that shown in FIG. 3.

For instance, if, in FIG. 1, the dielectric layers 5 are made of thermally conductive material, this is a four-layer structure according to an embodiment of the present invention. If, in FIG. 2, the dielectric layers 500 are made of thermally conductive material, this is an eight-layer structure according to an embodiment of the invention. Similarly, if, in FIG. 4, the dielectric layers 502 are made of thermally conductive material, this is a twelve-layer structure according to an embodiment of the invention. These modified embodiments have the same effects as those of the fourteenth embodiment.

A fifteenth embodiment of the invention is a method for soldering electronic chips or parts to a circuit board according to one or a combination of the first to fourteenth embodiment, wherein the electronic parts are inserted in the through-holes of the circuit board so that the circuit board and the inserted parts are preheated, and after sufficient preheating of the circuit board and inserted parts, the soldering operation is performed to these parts.

If the soldering work is carried out for the parts with respect to such a circuit board without using the preheating method above, the heat applied to the through-holes connected in such a manner as to reduce the heat resistance to the highly thermally conductive layers such as the ground and power supply layers rapidly conducts or dissipates to the highly heat conductive layers such as the ground layer and power supply layer, as a result of which the soldering is not well performed. On the contrary, when the method according to the embodiment of the invention is applied to the soldering, since the highly heat conductive layers such as the ground layer and power supply layer are preheated to a high temperature, the heat applied to the through-holes hardly escapes to the highly heat conductive layers such as the ground and power source layers. Thus, it is possible to well perform the soldering work.

According to a sixteenth embodiment of the invention, when the electronic parts such as ICs and LSIs are mounted on the circuit board of any one or combination of some of the first through fourteenth embodiments, sockets for the electronic parts are incorporated into the circuit board by inserting the pins of the sockets in the through-holes of the circuit board in advance; the soldering work to connect the sockets to the circuit board is performed after the circuit board has been heated in advance as shown in the fifteenth embodiment; and the ICs and LSLs are inserted into the sockets after the cooling is effected.

In such a circuit board as in the first to fourteenth embodiment of the invention, in the case where the parts are mounted in accordance with the method of the fifteenth embodiment, if the preheating period of time is too long or the preheating temperature is too high, there is a fear that semiconductor devices such as the ICs and LSIs incorporated into the circuit board would be deteriorated or would not operate normally.

On the other hand, if the future of the method of the sixteenth embodiment is used, it is possible to mount the parts on the circuit board without subjecting the the ICs and LSIs to the high temperature.

According to the circuit board of the invention, as described hereinbefore, it is possible to transfer the heat to the cooling device(s) or portion(s) provided at the ends of the ground layers and the power supply layers within the circuit boards.

In addition, by arranging the ground layers and/or power supply layers adjacent to the circuit-conductor boards through the dielectric layers, it is possible to reduce the impedances of circuit-conductors on the circuit-conductor layers. Thus, it is possible to suppress the noise due to cross-talk by the electrostatic coupling between the parallel conductor portions or signal lines on the circuit-conductor layers.

Moreover, in the circuit board according to the invention, the electric power is supplied from the power supply unit through the power supply plate(s) and ground plate(s) to the mother board, so that the power supply potential and the ground potential used as the references for the entire system can be stabilized on the power supply plates and ground plates, respectively. It is therefore possible to stabilize the power supply potential and ground potential in the mother board(s) and daughter board(s).

Furthermore, as each of the mother board(s) and the daughter board(s) includes the power supply layer(s) and the ground layer(s) in a multilayer form, it is possible to reduce the impedances of the ground layers and the power supply layers themselves and it is possible to suppress, within the circuit board, a change in power supply potential and ground potential during the operation including the high frequency components.

Moreover, because the chip-mounted circuit board according to an embodiment of the invention is characterized in that the heat generated from the circuit chips can be dissipated over the entire circuit board through the highly thermally conductive layers such as the inner ground and power supply layers, and in that the high temperature chips are arranged where the flow rates of the cooling fluid are increased and the turbulences are generated in the cooling fluid, the cooling effect thereat is enhanced in comparison with the other low temperature chips on the circuit board. Accordingly, it is possible to make the temperature uniform over the circuit board.

Furthermore, in the preferred method for mounting the circuit board according to the invention, when the pins of the circuit chip inserted in the through-holes connected to the highly thermally conductive layers such as the ground layers and power supply layers in the manner to reduce the heat resistance are connected to the through-holes by soldering, the highly heat conductive layers such as the ground layers and the power source layers are preheated so that the temperature difference between these layers and the melting point of the solder may be small. Therefore, the heat would hardly escape during the soldering work. It is thus possible to perform a good soldering.

What is claimed is:
1. A circuit board apparatus, comprising:
  a mother board having a ground layer and a power supply layer;
  a circuit board having a multilayer structure composed of at least one circuit-conductor layer situated at an intermediate position of the circuit board in a thickness direction of the board, at least one ground layer and at least one power supply layer spaced through dielectric layers interposed therebetween, said circuit-conductor layer being arranged such that the ground or power supply layer is disposed on either side thereof and adjacent thereto through one of said dielectric layers, each of the ground layer or the power supply layer being thick enough to allow heat to conduct therethrough effectively, said circuit board further having at least two throughholes, the circuit board being mounted on the mother board in such a manner that the ground and power supply layers of the circuit board are connected respectively to the ground and power supply layers of the mother board;

a plurality of electronic circuit chips mounted on the power supply pins, respectively connected in said through-holes to said ground and the power supply layers of the circuit board, for conducting therethrough heat generated from the chip;

a ground plate connected to the ground layer of the mother board through one conductive member; and a power supply plate connected to the power supply layer of the mother board through another conductive member, whereby the heat generated from the at least one chip mounted on the circuit board is conducted through said pins thereof to said power supply and ground layers of the circuit board to which they are connected, so that a part of the heat can be spread over the circuit board and removed therefrom by fluid which flows along a surface of the circuit board, and so that a part of the heat can be further conducted through a connector between the circuit board and the mother board to the associated power supply and ground layers of the mother board and spread over the mother board so as to be removed therefrom by fluid which flows along a surface of the mother board.

2. The circuit board apparatus according to claim 1, wherein one of said pins is electrically insulated from an inner circuit of the electronic circuit chip.

3. A circuit board apparatus according to claim 1, wherein a part of the heat can be further conducted to the connected power supply and ground plates and spread thereover to be removed therefrom by fluid which flows along a surface of the power supply and ground plates.

4. A circuit board apparatus, comprising:

a mother board having a ground layer and a power supply layer;

a circuit board having a multilayer structure composed of at least one circuit-conductor layer situated at an intermediate position of the circuit board in a thickness direction of the board, at least one ground layer and at least one power supply layer spaced through dielectric layers interposed therebetween, said circuit-conductor layer being arranged such that the ground or power supply layer is disposed on either side thereof and adjacent thereto through one of said dielectric layers, each of the ground layer or the power supply layer being thick enough to allow heat to conduct therethrough effectively, said circuit board further having at least two through-holes, the circuit board being mounted on the mother board in such a manner that the ground and power supply layers of the circuit board are connected respectively to the ground and power supply layers of the mother board; and a plurality of electronic circuit chips mounted on the circuit board, and at least one of said chips having ground and power supply pins, respectively connected in said through-holes to said ground and power supply layers of the circuit board, for conducting therethrough heat generated from the at least one chip, whereby the heat generated from the at least one chip mounted on the circuit board is conducted through the ground and power supply pins thereof to the power supply and ground layers of the circuit board to which it is connected, so that a part of the heat can be spread over the circuit board and be removed therefrom by fluid which flows along a surface of the circuit board, and so that a part of the heat can be further conducted through the circuit board to the power supply and ground layers of the mother board and spread over the mother board so as to be removed therefrom by fluid which flows along a surface of the mother board.

* * * * *

UNITED STATES PATENT AND TRADEMARK OFFICE
CERTIFICATE OF CORRECTION

PATENT NO. : 5,371,653

DATED : December 6, 1994

INVENTOR(S) : Masatsugu Kametani, Kazuhiro Umekita

It is certified that error appears in the above-identified patent and that said Letters Patent is hereby corrected as shown below:

In Claim 1, Column 27, Line 18, before "power" insert --circuit board, and at least one of said chips having ground and--

Signed and Sealed this

Nineteenth Day of March, 1996

*Attest:*

BRUCE LEHMAN

*Attesting Officer*  *Commissioner of Patents and Trademarks*